US012666621B2

(12) United States Patent (10) Patent No.: US 12,666,621 B2
Lu et al. (45) Date of Patent: Jun. 23, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Wen-Ling Lu, Taoyuan (TW); Yu-Chien Chiu, Hsinchu (TW); Chih-Yu Chang, New Taipei (TW); Hung-Wei Li, Hsinchu (TW); Ya-Yun Cheng, Taichung (TW); Zhiqiang Wu, Hsinchu (TW); Yu-Ming Lin, Hsinchu (TW); Mauricio Manfrini, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 761 days.

(21) Appl. No.: 17/840,824

(22) Filed: Jun. 15, 2022

(65) Prior Publication Data

US 2023/0413571 A1 Dec. 21, 2023

(51) Int. Cl.
H10B 51/20 (2023.01)
G11C 11/22 (2006.01)
H10B 51/10 (2023.01)
(52) U.S. Cl.
CPC ............ H10B 51/20 (2023.02); G11C 11/223 (2013.01); H10B 51/10 (2023.02)

(58) Field of Classification Search
CPC ...... H10B 51/20; H10B 51/10; G11C 11/223; H10D 30/701
See application file for complete search history.

(56) References Cited

U.S. PATENT DOCUMENTS

| | | | | |
|---|---|---|---|---|
| 2021/0111179 A1* | 4/2021 | Shivaraman | ........... | H10B 53/10 |
| 2021/0375933 A1* | 12/2021 | Lu | ........... | H10B 51/20 |
| 2021/0375937 A1* | 12/2021 | Wu | ........... | H10D 64/693 |
| 2022/0005830 A1 | 1/2022 | Wu et al. | | |
| 2022/0020775 A1 | 1/2022 | Yang et al. | | |
| 2022/0189546 A1* | 6/2022 | Gong | ........... | G11C 11/223 |
| 2023/0165012 A1* | 5/2023 | Nam | ........... | H10D 30/60 |
| | | | | 257/295 |

* cited by examiner

*Primary Examiner* — Marlon T Fletcher
*Assistant Examiner* — Da Wei Lee
(74) *Attorney, Agent, or Firm* — NZ Carr Law Office

(57) ABSTRACT

Various embodiments of the present disclosure provide a memory device and methods of forming the same. In one embodiment, a memory device is provided. The memory device includes a first oxide material having a first sidewall and a second sidewall, a first spacer layer in contact with the first sidewall of the first oxide material, the first spacer layer having a first conductivity type, a second spacer layer in contact with the second sidewall of the first oxide material, wherein the second spacer layer has the first conductivity type. The memory device also includes a channel layer having a second conductivity type that is opposite to the first conductivity type, wherein the channel layer is in contact with the first oxide material, the first spacer layer, and the second spacer layer. The memory device further includes a ferroelectric layer in contact with the channel layer.

20 Claims, 44 Drawing Sheets

201/201T
203
201
203
201
203
201

202

119

50

206

206

206

200

SEMICONDUCTOR DEVICE STRUCTURE AND METHODS OF FORMING THE SAME

BACKGROUND

Ferroelectric field effect transistor (FeFET) is a field-effect transistor that includes a ferroelectric layer sandwiched between a gate electrode and source/drain region of a device. FeFET based devices can be used in FeFET memory—a type of single transistor binary non-volatile memory. FeFET based devices are a promising candidate for next generation non-volatile memory applications due to its low power requirements, small size, and fast write/read operation. However, FeFET based memory devices, especially ferroelectric random-access memory (FeRAM) devices employing oxide semiconductor as a channel material, have been found difficult to obtain a uniform electric field across the ferroelectric layer (which is required to enable proper polarization switching of the ferroelectric layer during program and erase operations). This is because the wide band gap associated with the nature of oxide semiconductors would result in the lack of sufficient hole carriers in the oxide semiconductor. When there are insufficient hole carriers in the oxide semiconductor channel, a negative voltage applied to the gate electrode can only induce low electric field in the ferroelectric layer. Therefore, a full polarization switching in the ferroelectric layer at oxide semiconductor channel region cannot be triggered, resulting in lower erase efficiency during the erase operation.

Therefore, an improved FeFET based memory device and methods of forming the same are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-14A illustrate a perspective view of a three-dimensional (3D) ferroelectric random access memory (FeRAM) device at various stages of manufacturing, in accordance with some embodiments of the present disclosure.

FIGS. 2B-14B illustrate a cross-sectional view of a portion of the FeRAM device taken along the plane B-B shown in FIGS. 2A-11A, respectively.

FIGS. 7C-14C illustrate a cross-sectional view of a portion of the FeRAM device taken along the plane C-C shown in FIGS. 7A-14A, respectively.

FIGS. 7D-14D illustrate a plane view of a portion of the FeRAM device taken along the plane D-D shown in FIGS. 7A-14A, respectively.

DETAILED DESCRIPTION

Figure 1:
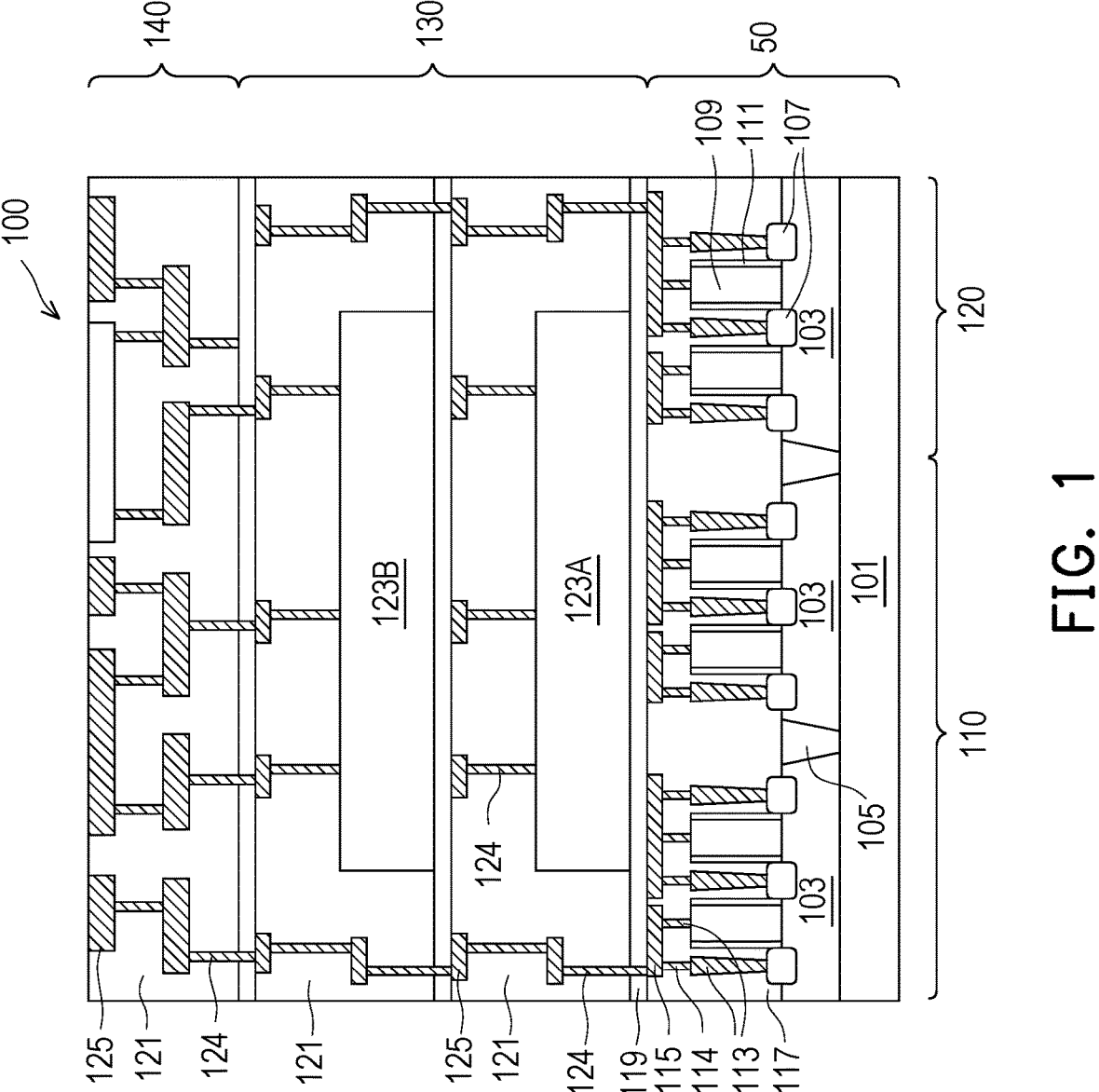
FIG. 1 illustrates a cross-sectional view of a semiconductor device structure with integrated memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of a semiconductor device structure 100 with integrated memory devices 123 (e.g., 123A and 123B), in accordance with some embodiments of the present disclosure. The semiconductor device structure 100 may be a field-effect transistor (FET) based device with three-dimensional (3D) ferroelectric random access memory (FeRAM) devices 123 integrated in a back-end-of-line (BEOL) processing of semiconductor manufacturing. In one exemplary embodiment, the semiconductor device structure 100 is a fin field-effect transistor (FinFETs) device. It should be noted that FinFET is used as a non-limiting example here, the FeRAM devices 123 may also be integrated in the BEOL processing with any suitable FET devices. Exemplary FETs may include, but are not limited to, planar FETs, nanosheet FETs, Horizontal Gate All Around (HGAA) FETs, Vertical Gate All Around (VGAA) FETs, and other suitable devices. For ease of illustration, details of the memory devices 123 are not shown in FIG. 1, but are illustrated in subsequent figures hereinafter.

As shown in FIG. 1, the semiconductor device structure 100 generally includes different regions for forming different types of circuits. For example, the semiconductor device structure 100 may include a first region 110 for forming logic circuits, and may include a second region 120 for forming, e.g., peripheral circuits, input/output (I/O) circuits, electrostatic discharge (ESD) circuits, and/or analog circuits. Other regions for forming other types of circuits are contemplated and are intended to be included within the scope of the present disclosure.

The semiconductor device structure 100 includes a substrate 101. The substrate 101 may be a bulk substrate, such as a silicon substrate, undoped or doped with impurities (e.g., dopants having p-type or n-type impurities), or an active layer of a semiconductor-on-insulator (SOI) substrate. The substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, InAlAs, AlGaAs, GaInP, GaInAsP, GaAsSb, and/or GaSbP; or combinations thereof. Other substrates, such as multi-layered or gradient substrates, may also be used.

Electrical components, such as transistors, resistors, capacitors, inductors, diodes, or the like, are formed in or on the substrate 101 in the front-end-of-line (FEOL) processing of semiconductor manufacturing. In one example shown in FIG. 1, semiconductor fins 103 (also referred to as fins) are formed protruding above the substrate 101. Isolation regions 105, such as shallow-trench isolation (STI) regions, are formed between or around the semiconductor fins 103. Gate electrodes 109 are formed over the semiconductor fins 103. Gate spacers 111 are formed along the sidewalls of the gate electrodes 109. Source/drain regions 107, such as epitaxial source/drain regions, are formed on opposing sides of the gate electrodes 109. Contacts 113, such as gate contacts and source/drain contacts, are formed over and electrically coupled to respective underlying electrically conductive features (e.g., gate electrodes 109 or source/drain regions 107). One or more dielectric layers 117, such as an inter-layer dielectric (ILD) layer, is formed over the substrate 101 and around the semiconductor fins 103 and the gate electrodes 109. Other electrically conductive features, such as interconnect structures comprising conductive lines 115 and vias 114, may also be formed in the one or more dielectric layers 117. For ease of discussion, the substrate 101, the electrical components (e.g., FinFETs) formed in or on the substrate 101, the contacts 113, conductive features 115, 114, and the one or more dielectric layers 117 are collectively referred to as substrate 50.

Still referring to FIG. 1, an etch stop layer (ESL) 119 is formed over the one or more dielectric layers 117. In one embodiment, the ESL 119 is formed of silicon nitride using plasma-enhanced physical vapor deposition (PECVD), although other dielectric materials such as nitride, carbide, combinations thereof, or the like, and alternative techniques of forming the ESL 119, such as low-pressure chemical vapor deposition (LPCVD), PVD, or the like, may alternatively be used. In some embodiments, the ESL 119 is omitted. Next, a dielectric layer 121 is formed over the ESL 119. The dielectric layer 121 may be any suitable dielectric material, such as silicon oxide, silicon nitride, or the like, formed by a suitable method, such as PVD, CVD, or the like. One or more memory devices 123A, each of which includes a plurality of memory cells, are formed in the dielectric layer 121 and coupled to electrically conductive features (e.g., vias 124 and conductive lines 125) in the dielectric layer 121.

FIG. 1 further illustrates a second layer of memory devices 123B formed over the memory devices 123A. The memory devices 123A and 123B may have the same or similar structure, and may be collectively referred to as memory devices 123. While FIG. 1 shows two layers of memory devices 123, other numbers of layers of memory devices 123, such as one layer, three layers, or more, are also possible. The one or more layers of memory device 123 are formed in a memory region 130 of the semiconductor device structure 100, and may be formed in the back-end-of-line (BEOL) processing of semiconductor manufacturing. The memory devices 123 may be formed in the BEOL processing at any suitable locations within the semiconductor device structure 100, such as over (e.g., directly over) the first region 110, over the second region 120, or over a plurality of regions. Various embodiments of the memory devices 123A or 123B in FIG. 1 are discussed below in more detail.

In one embodiment of FIG. 1, the memory devices 123 occupy some, but not all, of the areas of the memory region 130 of the semiconductor device structure 100. Other features, such as conductive lines 125 and vias 124, may be formed in other areas of the memory region 130 for connection to conductive features over and below the memory region 130. During formation of the memory devices 123, a mask layer, such as patterned photoresist layer, is formed to cover some areas of the memory region 130, while the memory devices 123A or 123B are formed in other areas of the memory region 130 not covered by the mask layer. After the memory devices 123 are formed, the mask layer is removed.

After the memory region 130 is formed, an interconnect structure 140, which includes dielectric layer 121 and electrically conductive features (e.g., vias 124 and conductive lines 125) in the dielectric layer 121, is formed over the memory region 130. The interconnect structure 140 may electrically connect the electrical components formed in/on the substrate 101 to form functional circuits. The interconnect structure 140 may also electrically couple the memory devices 123 to the components formed in/on the substrate 101, and/or couple the memory devices 123 to conductive pads formed over the interconnect structure 140 for connection with an external circuit or an external device.

In some embodiments, the memory devices 123 are electrically coupled to the electrical components (e.g., transistors) formed on the substrate 50, e.g., by the vias 124 and conductive lines 125, and are controlled or accessed (e.g., written to or read from) by functional circuits of the semiconductor device structure 100. Additionally or alternatively, the memory devices 123 are electrically coupled to conductive pads formed over a top metal layer of the interconnect structure 140, in which case the memory devices 123 may be controlled or accessed by an external circuit (e.g., another semiconductor device) directly without involvement of the functional circuits of the semiconductor device structure 100. Although additional metal layers (e.g., the interconnect structure 140) are formed over the memory devices 123 in the example of FIG. 1, the memory devices 123 may be formed in a top (e.g., topmost) metal layer of the semiconductor device structure 100.

FIGS. 2A-14A illustrate a perspective view of a three-dimensional (3D) ferroelectric random access memory (Fe-RAM) device 200 at various stages of manufacturing, in accordance with some embodiments of the present disclosure. FIGS. 2B-14B illustrate a cross-sectional view of a portion of the FeRAM device 200 taken along the plane B-B shown in FIGS. 2A-11A, respectively. FIGS. 7C-14C illustrate a cross-sectional view of a portion of the FeRAM device 200 taken along the plane C-C shown in FIGS. 7A-14A, respectively. FIGS. 7D-14D illustrate a plane view of a portion of the FeRAM device 200 taken along the plane D-D shown in FIGS. 7A-14A, respectively. It is understood that additional operations can be provided before, during, and after processes shown by FIGS. 1A-15 and some of the operations described below can be replaced or eliminated, for additional embodiments of the method. The order of the operations/processes may be interchangeable. For ease of discussion, a 3D FeRAM device may also be referred to as a 3D memory device, or simply a memory device in the discussion herein. The 3D FeRAM device 200 is a three-dimensional memory device with a ferroelectric material. The 3D FeRAM device 200 may be used as the memory device 123A and/or 123B in FIG. 1. For the sake of simplicity, not all features of the 3D FeRAM device 200 are illustrated in the figures, and the figures may only show a portion of the 3D memory device 200.

Figure 2A:
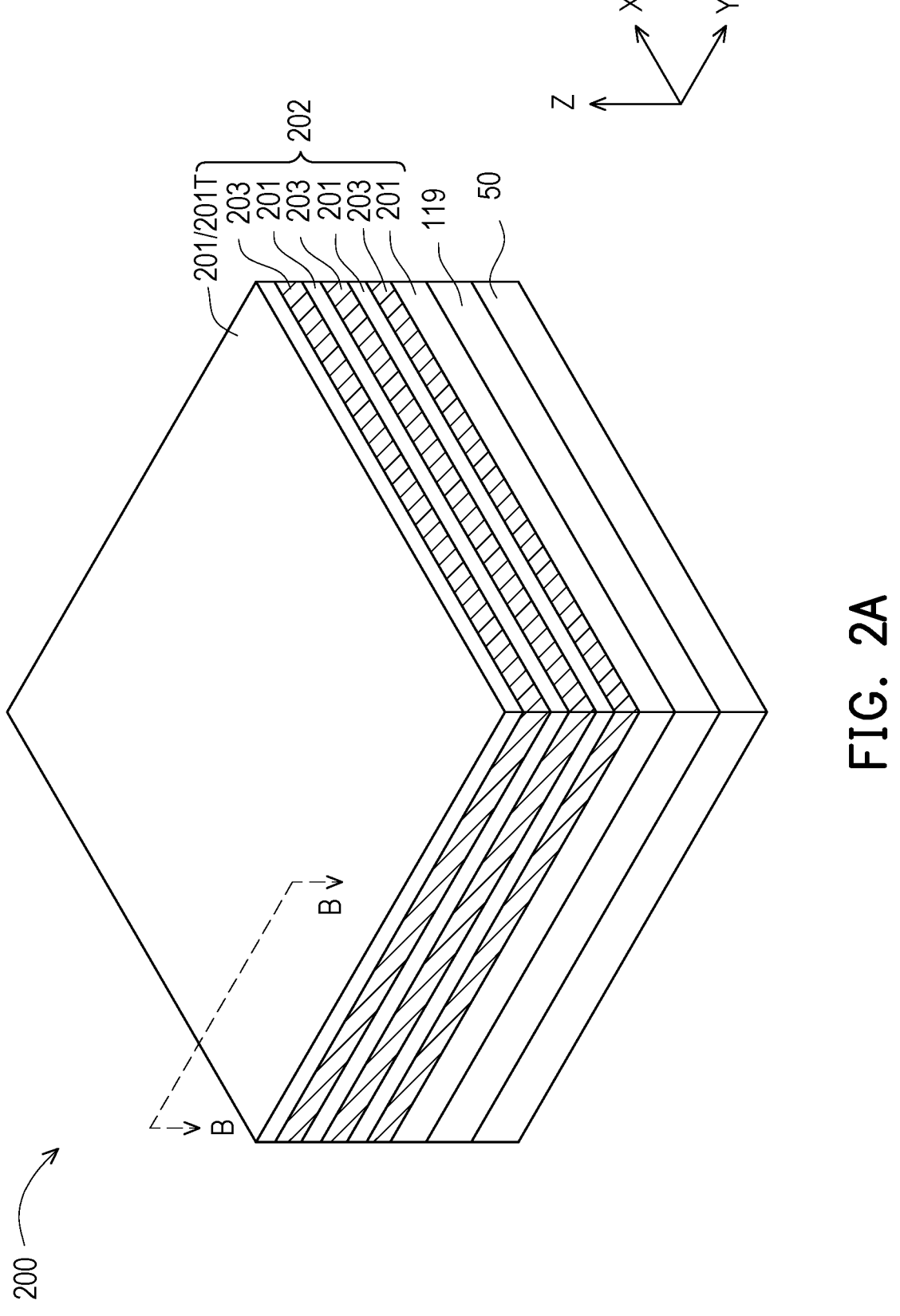
Figure 2B:
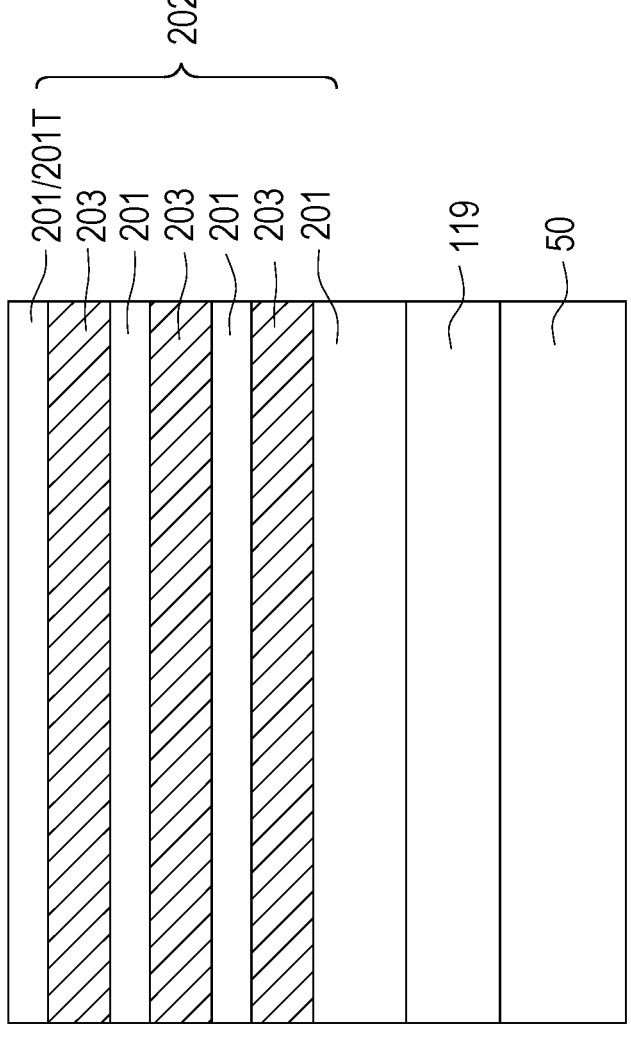

In FIGS. 2A and 2B, a layer stack 202 is formed over the substrate 50. In some embodiments, the ESL 119 is formed between the layer stack 202 and the substrate 50. The layer stack 202 includes alternating layers of a dielectric material 201 and an electrically conductive material 203. Each layer of the dielectric material 201 in the layer stack 202 may also be referred to as a dielectric layer 201, and each layer of the electrically conductive material 203 in the layer stack 202 may also be referred to as an electrically conductive layer 203. As will be discussed below, the electrically conductive material 203 is used to form word lines (WLs) of the 3D memory device 200, and therefore, may also be referred to as word line material 203.

The layer stack 202 can be formed by first forming the dielectric layer 201 on the substrate 50, and then forming the electrically conductive layer 203 over the dielectric layer 201. The deposition processes repeat until a target number of layers is formed in the layer stack 202. The dielectric layer 201 may be any suitable dielectric material, such as silicon oxide, silicon nitride, or the like, and may be deposited using a suitable deposition technique such as PVD, CVD, atomic layer deposition (ALD), or the like. The electrically conductive material may be a metal or metal-containing material. Exemplary materials for the electrically conductive layer 203 may include, but are not limited to, Al, Ti, TiN, TaN, Co, Ag, Cu, Ni, Cr, Hf, Ru, W, Pt, or the like, and may be formed by PVD, CVD, ALD, combinations thereof, or the like. In one embodiment, the topmost layer of the layer stack 202 is a dielectric layer 201, which may be referred to as a topmost dielectric layer 201T of the layer stack 202. It should be noted that the number of layers in the layer stack 202 can be any suitable number and is not limited to the example shown in FIG. 2A.

Figure 3A:
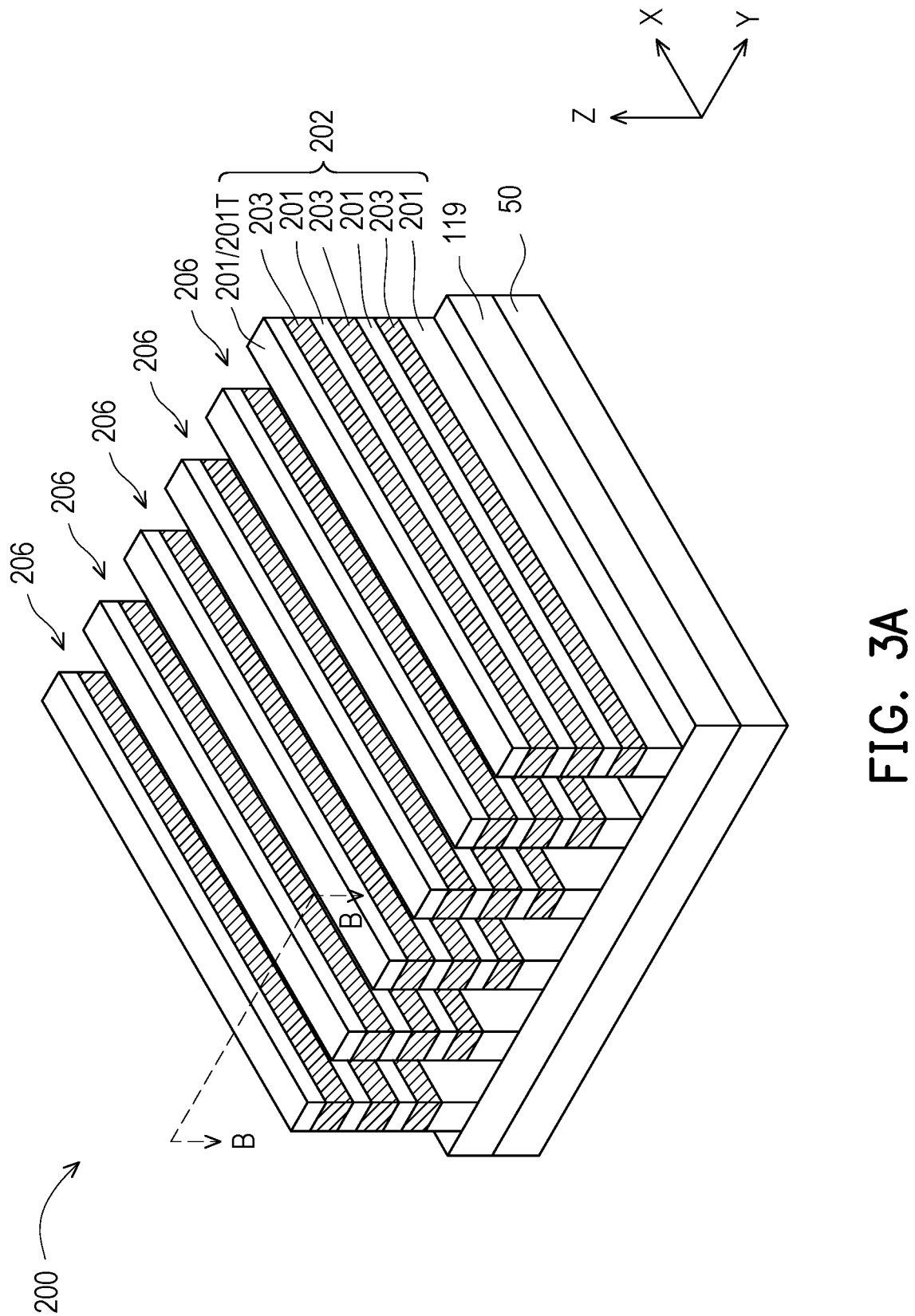
Figure 3B:
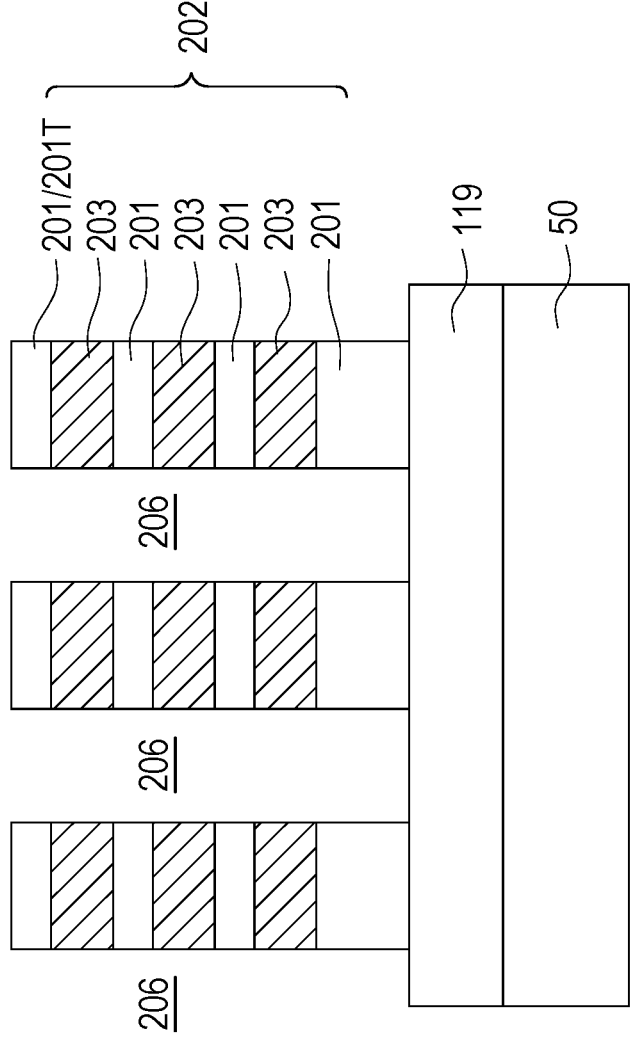
Figure 3B:

In FIGS. 3A and 3B, first trenches 206 are formed in the layer stack 202 and extend vertically through the layer stack 202 to expose a top surface of the ESL 119. The first trenches 206 may be formed using photolithography and etch techniques. In one embodiment, the first trenches 206 extend continuously between opposing sidewalls of the layer stack 202, such that the first trenches 206 cut through the layer stack 202 along the X-direction and separate the layer stack 202 into a plurality of slices (e.g., fin shaped structures) spaced apart from each other.

Figure 4A:
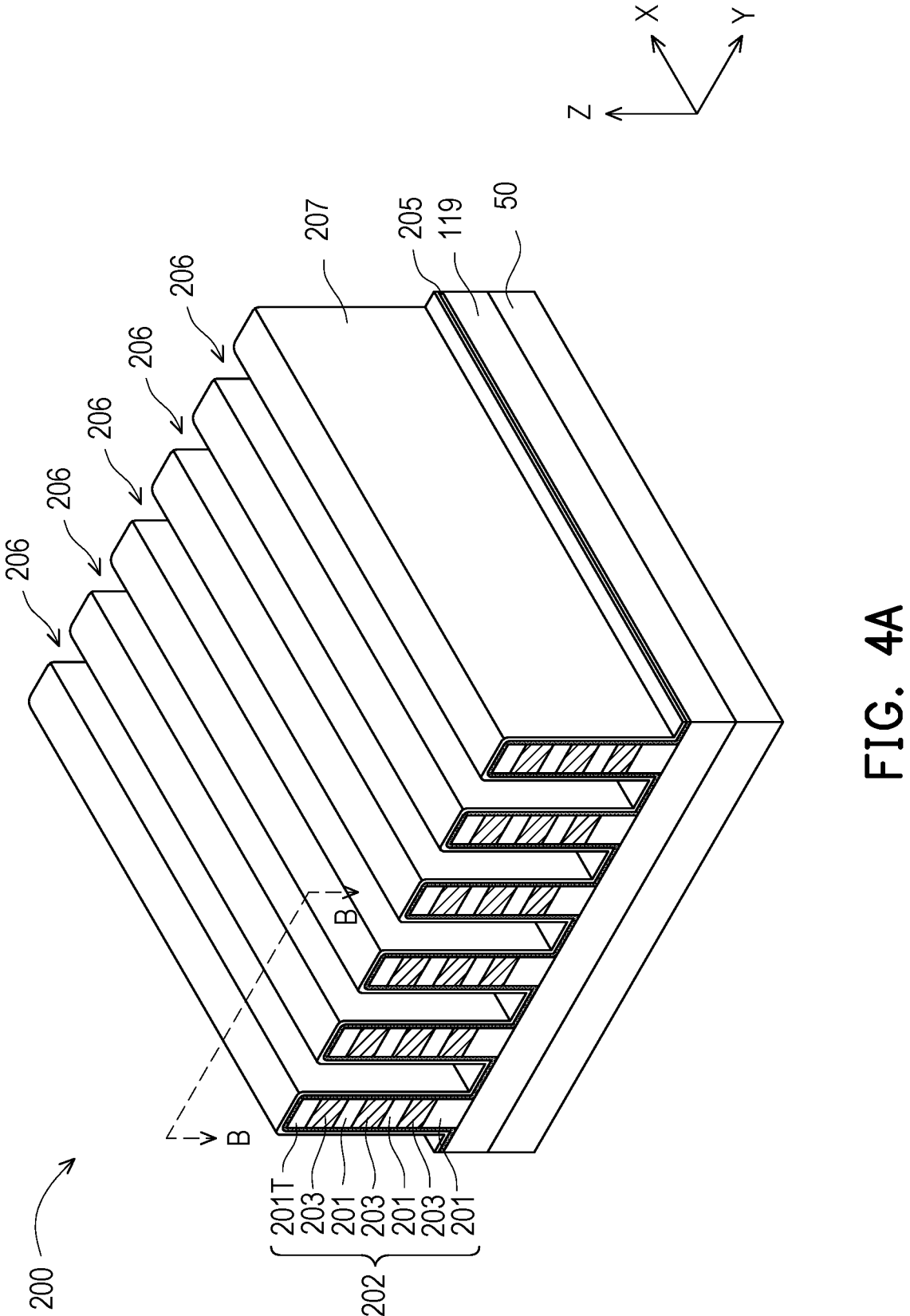
Figure 4B:
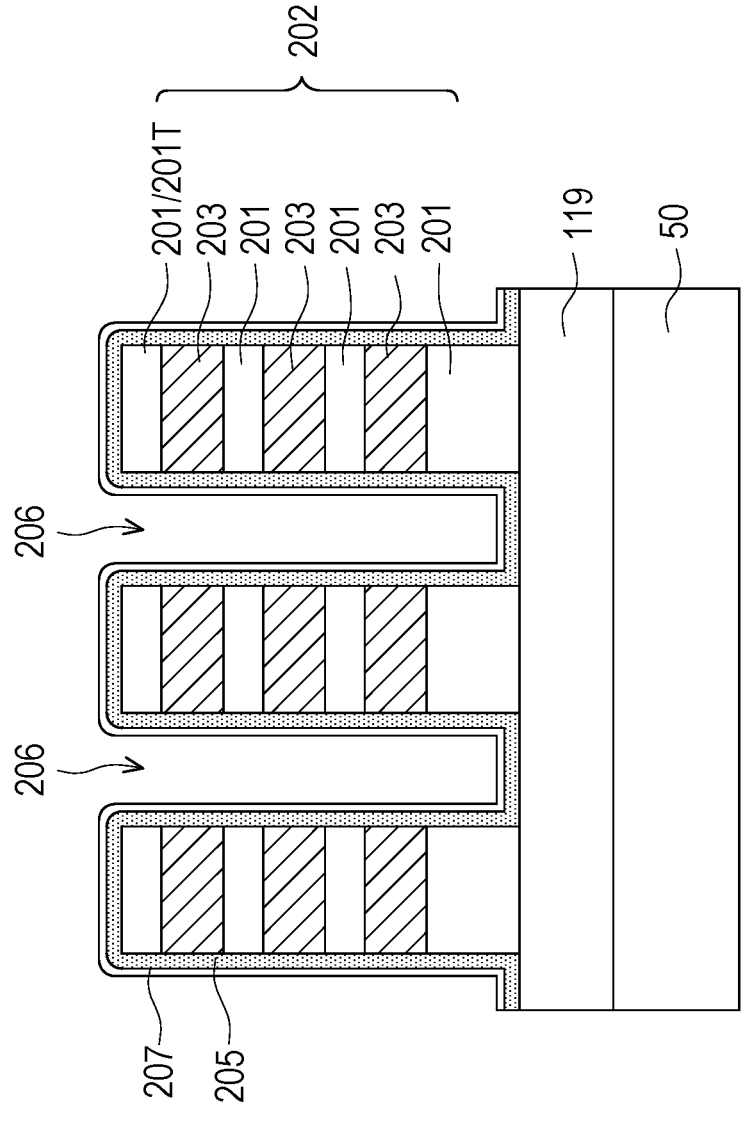

In FIGS. 4A and 4B, a ferroelectric layer 205 is conformally formed in the first trenches 206 along sidewalls and bottoms of the first trenches 206. The ferroelectric layer 205 may also be formed over the upper surface of the layer stack 202. The resulting ferroelectric layer 205 extends from an upper surface of the layer stack 202 distal to the substrate 50 to a lower surface of the layer stack 202 facing the substrate 50. The ferroelectric layer 205 is in contact with the alternating layers of the dielectric material 201 and the electrically conductive material 203 (i.e., word line material) in the layer stack 202. Next, a channel layer 207 is conformally formed over the ferroelectric layer 205. In some embodiments, the ferroelectric layer 205 is a ferroelectric dielectric material having two stable directions for electrical polarization. The two stable directions may be the upward direction and the downward direction, or may be a set of two opposite directions having a tilt angle with respect to the vertical direction. The electrical polarization direction of the ferroelectric layer 205 is used to store the digital information (e.g., a bit of 0 or 1) of each memory cell of the 3D memory device 200. The electrical polarization direction of the ferroelectric material 205 can be switched by an electric field applied to the ferroelectric layer 205, and the electric field may be proportional to a voltage applied across the ferroelectric layer 205.

The ferroelectric layer 205 may be formed of any suitable ferroelectric materials that exhibit ferroelectricity or has a spontaneous electric polarization, i.e., the material naturally possesses switchable dipole moments. Exemplary ferroelectric dielectric materials may include, but are not limited to, hafnium or zirconium oxide-based dielectrics, barium titanate, colemanite, bismuth titanate, europium barium titanate, ferroelectric polymer, germanium telluride, langbeinite, lead scandium tantalate, lead titanate, lead zirconate titanate, lithium niobate, polyvinylidene fluoride, potassium niobate, potassium sodium tartrate, potassium titanyl phosphate, sodium bismuth titanate, lithium tantalate, lead lanthanum titanate, lead lanthanum zirconate titanate, ammonium dihydrogen phosphate, potassium dihydrogen phosphate, and other suitable ferroelectric dielectric materials. The ferroelectric layer 205 may be deposited by any suitable deposition technique such as PVD, CVD, ALD, or the like. The thickness of the ferroelectric layer 205 may be in a range from about 2 nm to about 30 nm, although lesser or greater thickness may be used.

The channel layer 207 may be or include a semiconductive material or a metal oxide semiconductor material such as amorphous silicon (a-Si), polysilicon silicon (poly-Si), a semiconductive oxide, such as indium gallium zinc oxide (IGZO), zinc oxide (ZnO), indium oxide ($In_2O_3$), tin oxide (SnO), indium tin oxide (ITO), cadmium oxide (CdO), indium tungsten oxide (IWO), or other suitable n-type or p-type metal oxide semiconductor materials such as niobium oxide ($NbO_2$), nickel oxide (NiO), copper oxide ($Cu_2O$), copper aluminum oxide ($CuAlO_2$), copper gallium oxide ($CuGaO_2$), copper indium oxide ($CuInO_2$), strontium copper oxide ($SrCu_2O_2$), or the like. In some embodiments, the channel layer 207 is formed of n-type metal oxide semiconductor materials such as IGZO, ZnO, $In_2O_3$, $SnO_3$, or the like. In some embodiments, the channel layer 207 is formed of p-type metal oxide semiconductor materials such as NiO, $Cu_2O$, $CuAlO_2$, $CuGaO_2$, $CuInO_2$, $SrCu_2O_2$, SnO, or the like. The channel layer 207 may be deposited by any suitable deposition technique such as PVD, CVD, ALD, PECVD, MBD, or the like.

Figure 5A:
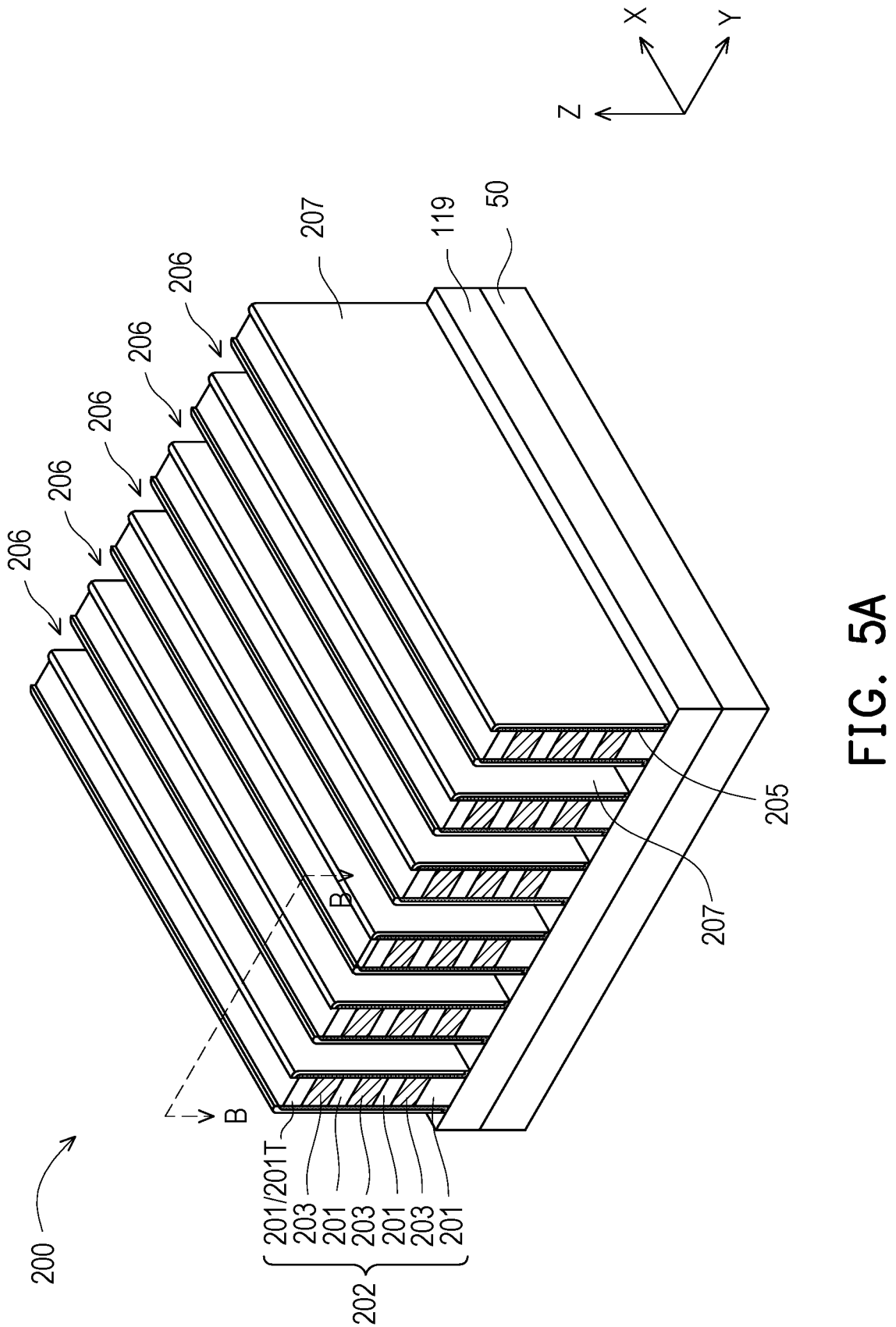
Figure 5B:
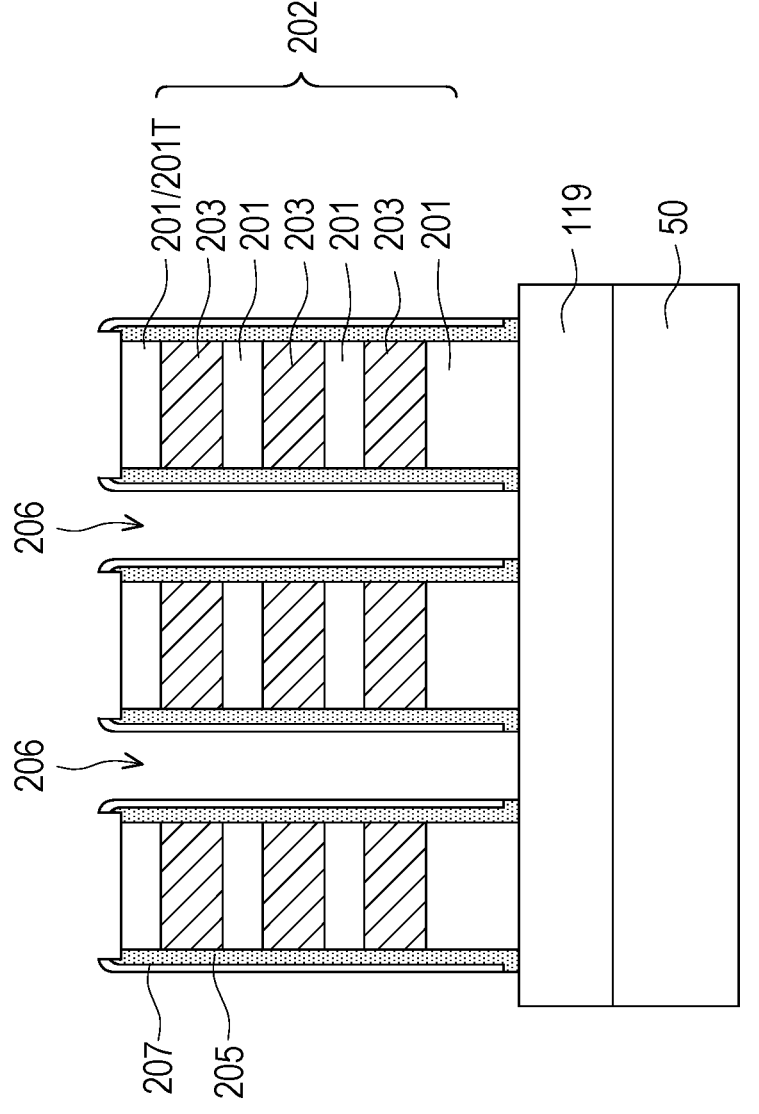

In FIGS. 5A and 5B, portions of the ferroelectric layer 205 and the channel layer 207 are removed by, for example, an anisotropic etch. During the removal process, most of the ferroelectric layer 205 and the channel layer 207 are removed from horizontal surfaces, such as a top of the topmost dielectric layers 201T of the layer stack 202 and a top of the ESL 119, leaving the ferroelectric layer 205 and the channel layer 207 on the vertical surfaces, such as sidewalls of the patterned layer stack 202, after the removal process. In some embodiments, the remaining portions of the ferroelectric layer 205 may have an L-shaped cross-section, and the channel layer 207, which extends from the upper surface of the layer stack 202 distal to the substrate 50 to a lower surface of the layer stack 202 facing the substrate 50, is in direct contact with the ferroelectric layer 205 having the L-shaped cross-section, as shown in FIG. 5B.

Figure 6A:
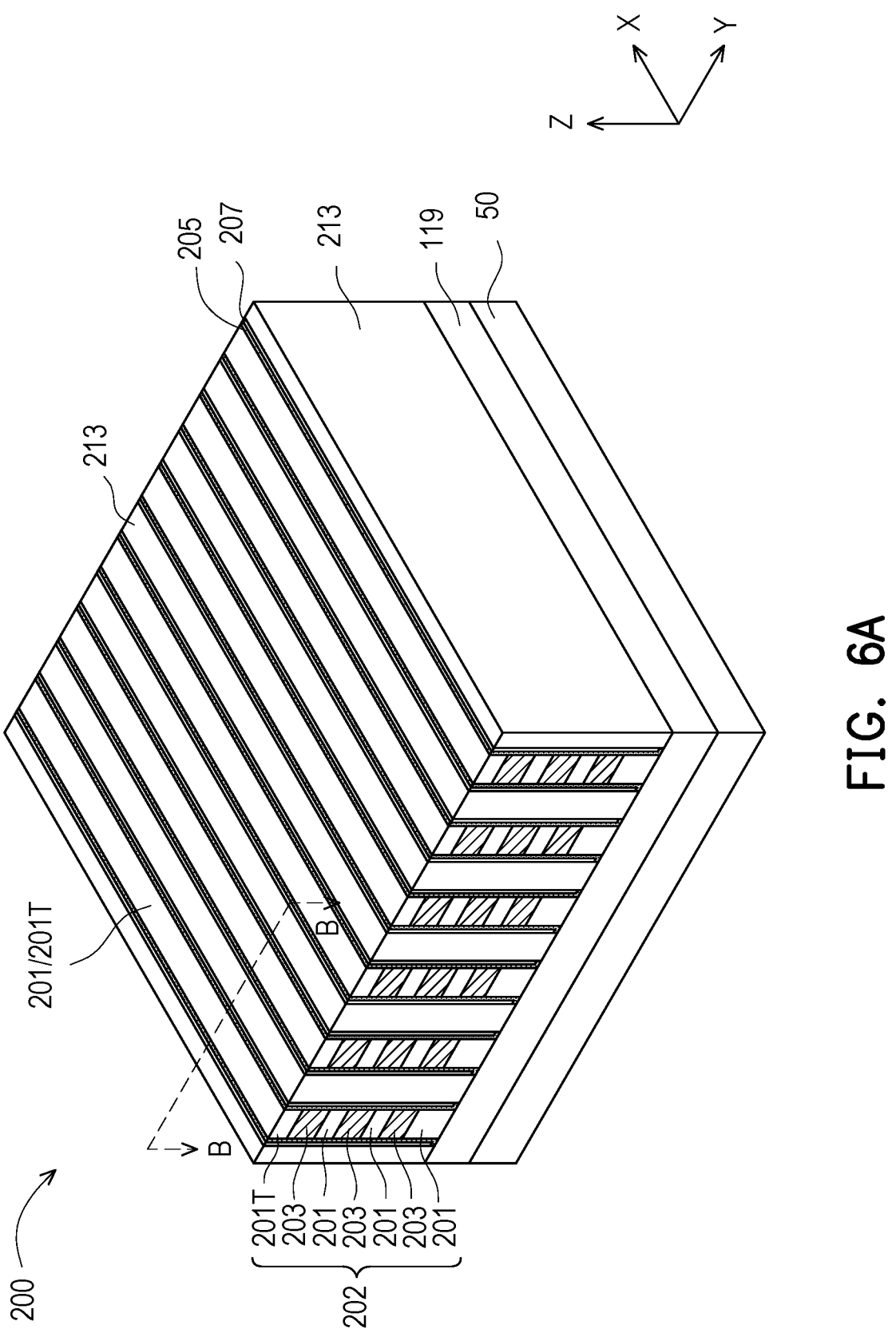
Figure 6B:
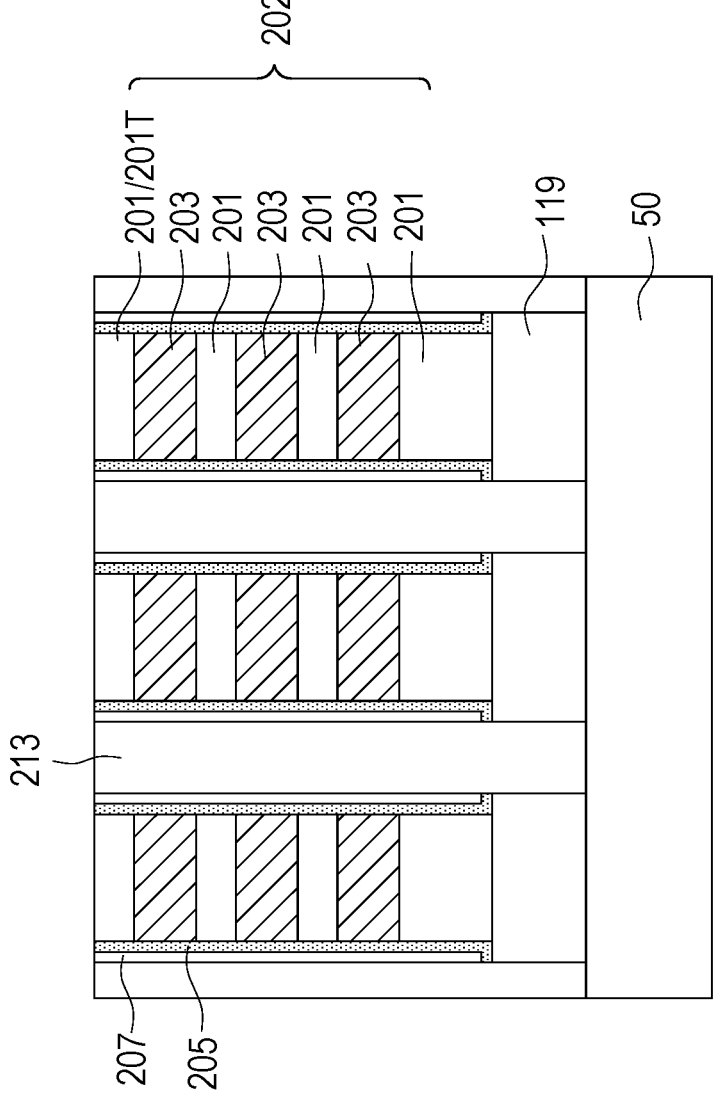

In FIGS. 6A and 6B, a first oxide material 213 is formed in the first trenches 206 to fill the remaining space in the first trenches 206. The first oxide material 213 may be silicon oxide, silicon oxynitride, or the like, and may be deposited using any suitable deposition technique such as ALD or the like. In one embodiment, the first oxide material 213 is silicon oxide. The first oxide material 213 may overfill the first trenches 206 and may be formed over an upper surface of the layer stack 202. Next, a planarization process, such as chemical mechanical planarization (CMP), is performed to remove excess portions of the ferroelectric layer 205, the channel layer 207, and the first oxide material 213 from the upper surface of the layer stack 202. The planarization process may be performed until the topmost dielectric layer 201T is exposed. After the planarization process, the top surfaces of the topmost dielectric layer 201T, the ferroelectric layer 205, the channel layer 207, and the first oxide material 213 are substantially co-planar. The first oxide material 213 serves as a channel region for subsequent source/drain features (e.g., 228s/228b as shown in FIG. 14C) of the FeRAM device 200.

Figure 7A:
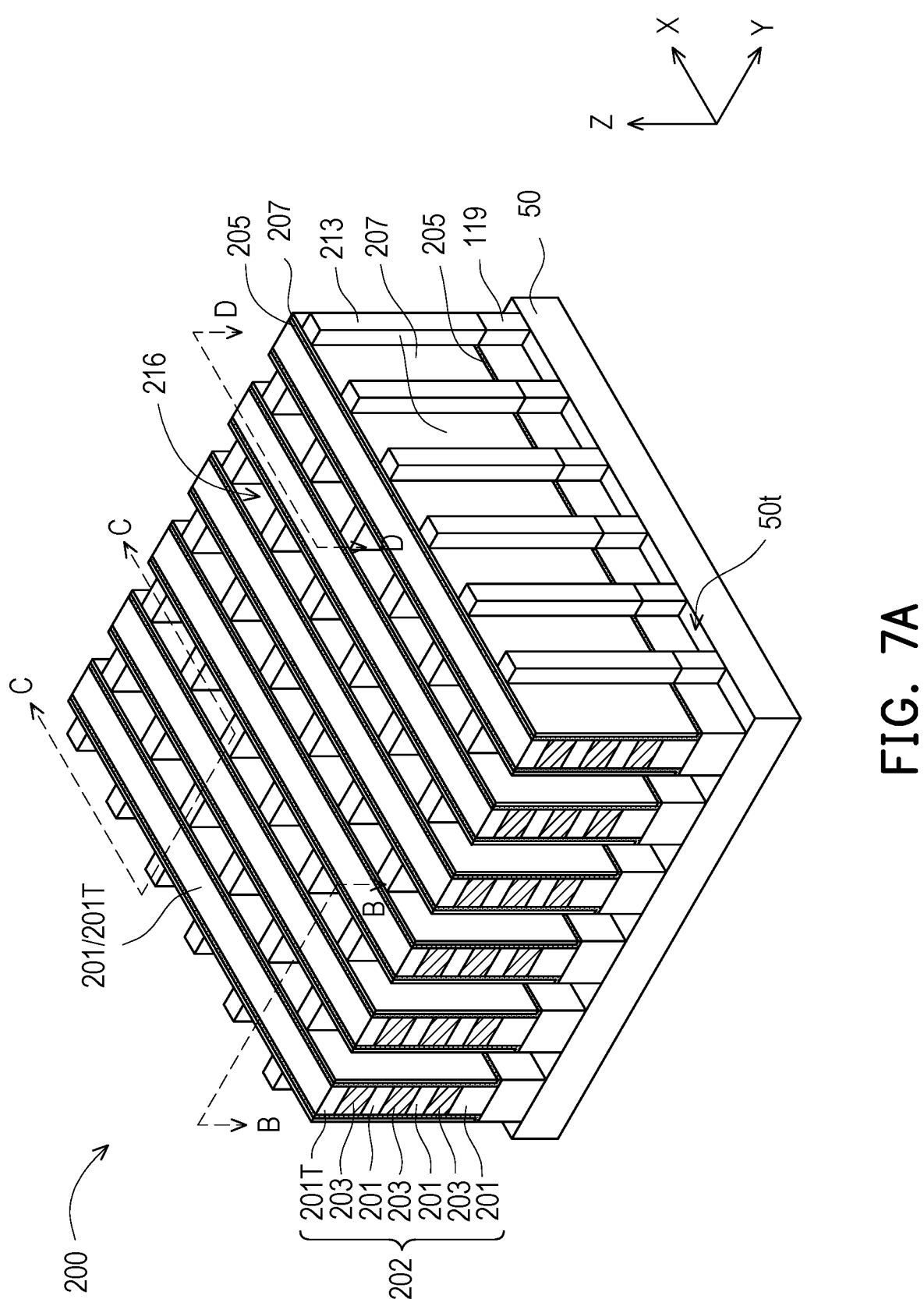
Figure 7B:
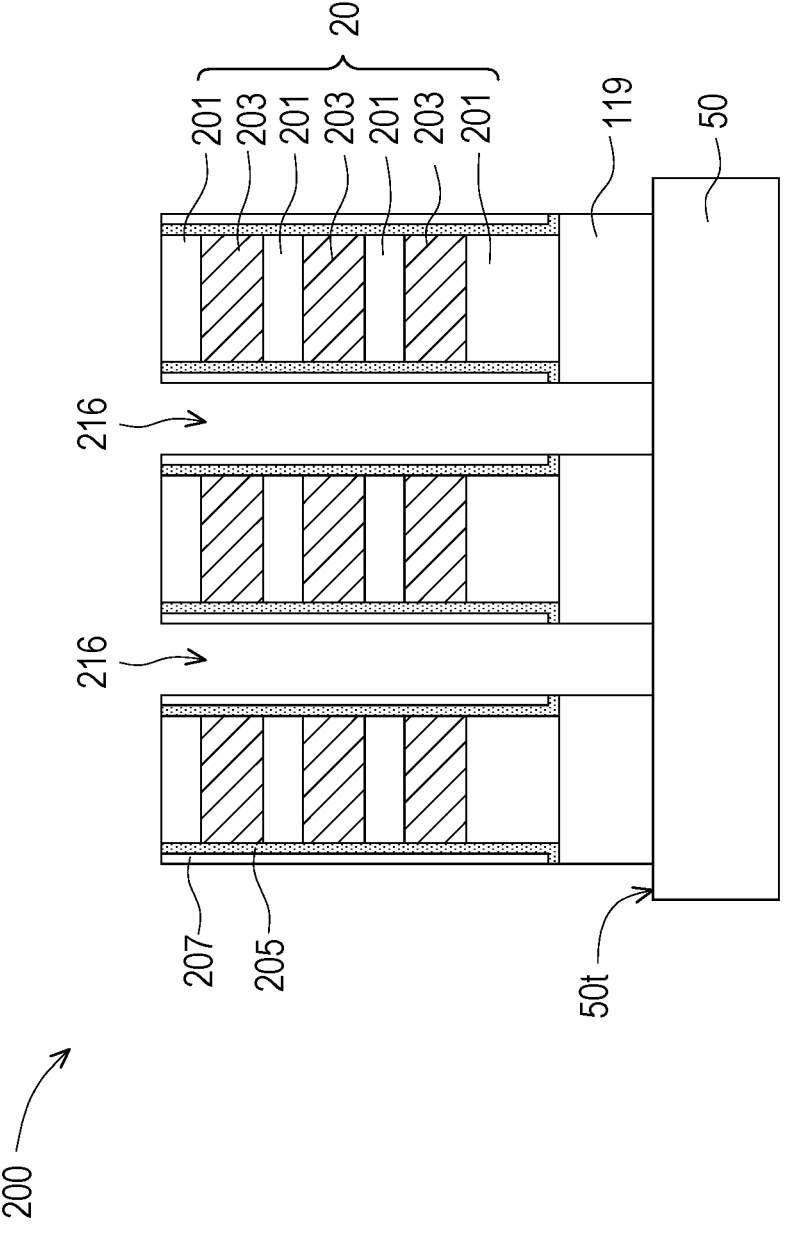
Figure 7C:
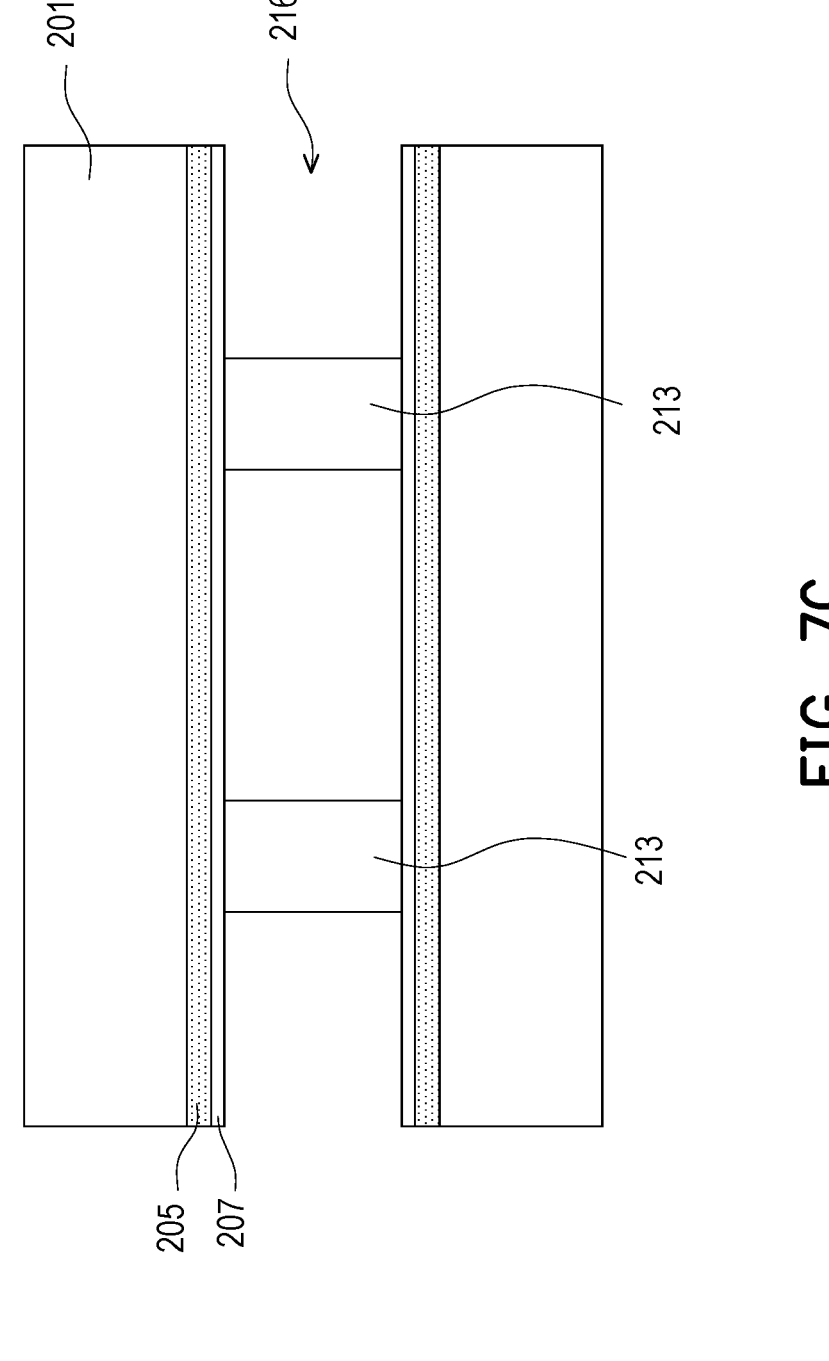
Figure 7D:
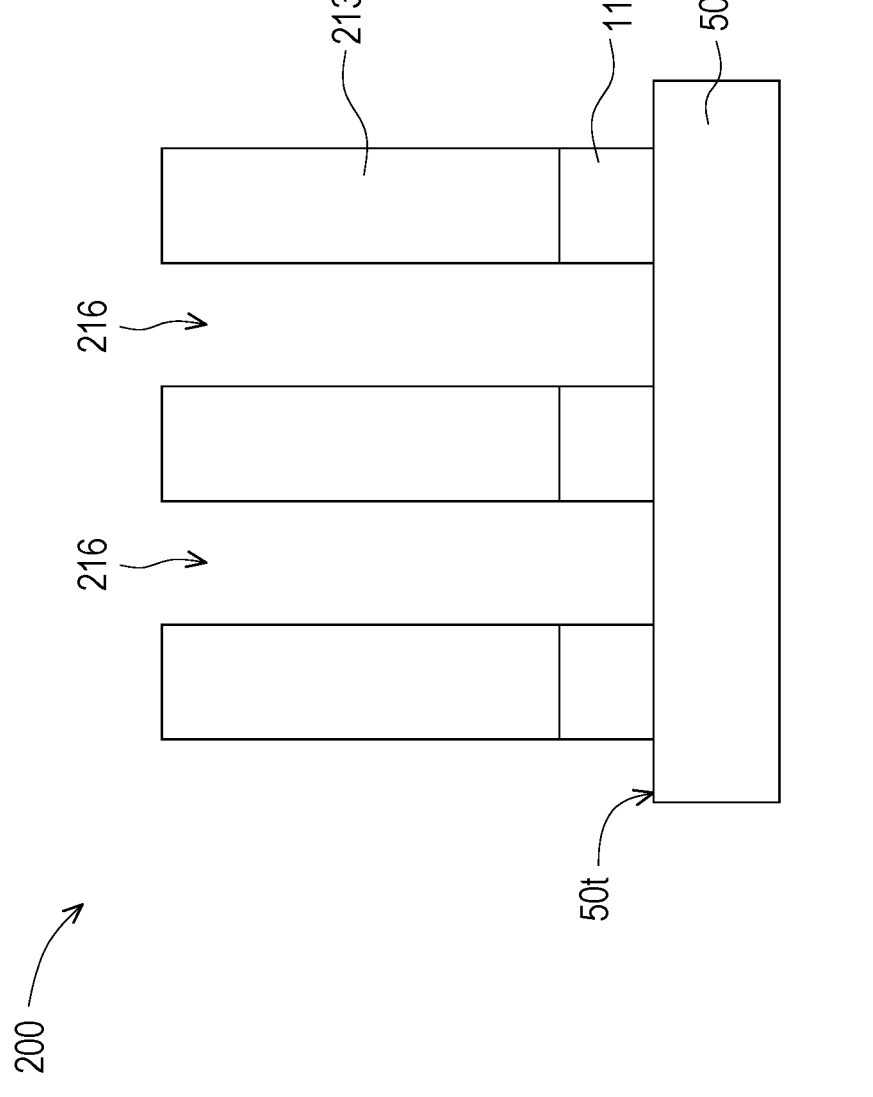
Figure 8A:
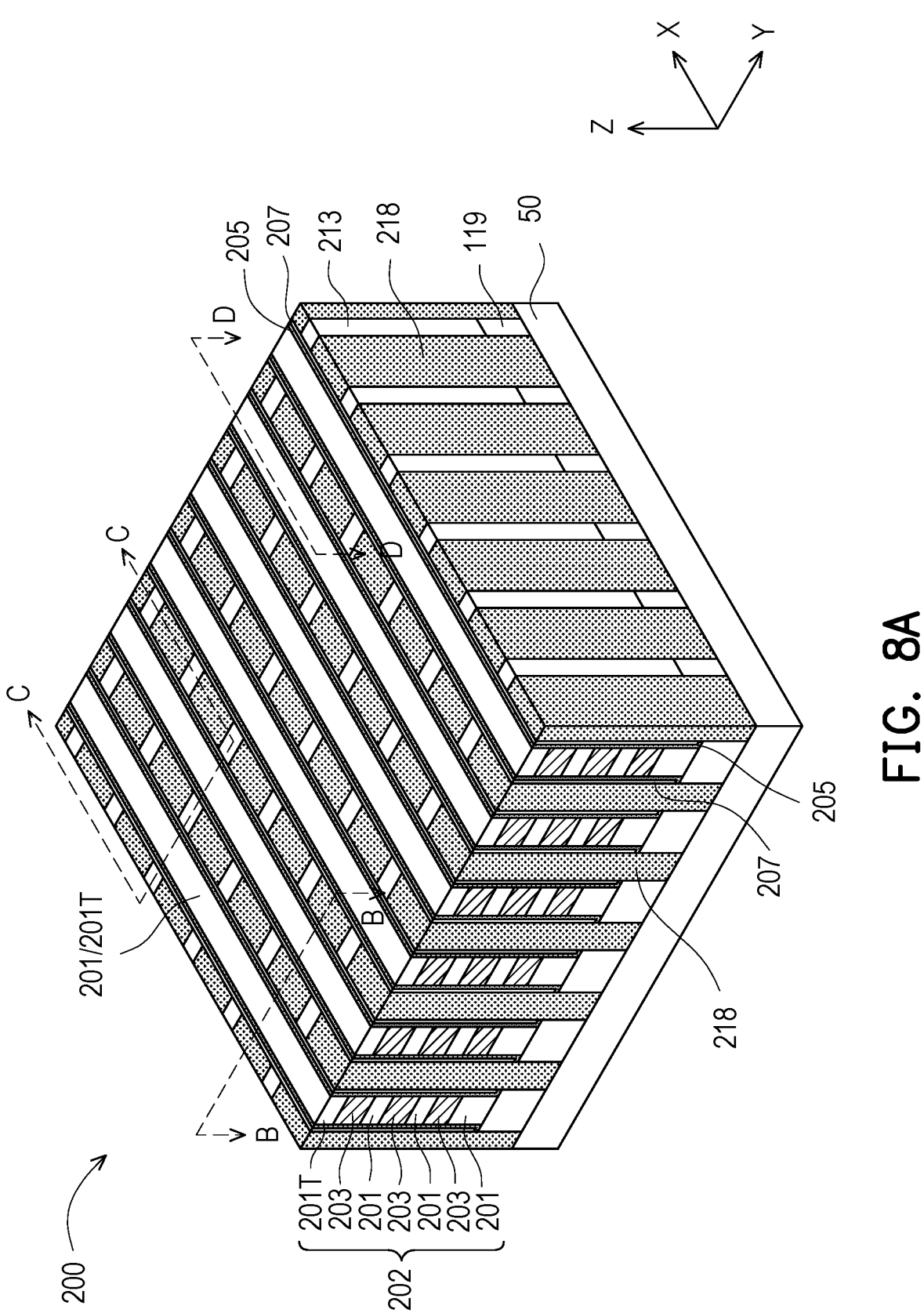
Figure 8B:
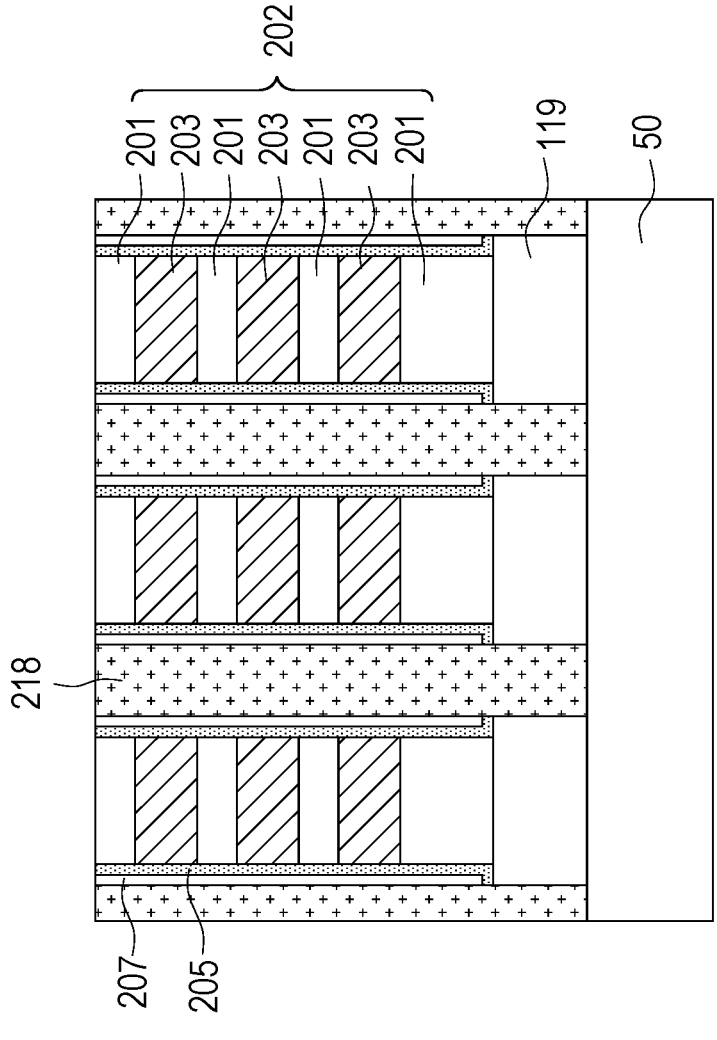
Figure 8C:
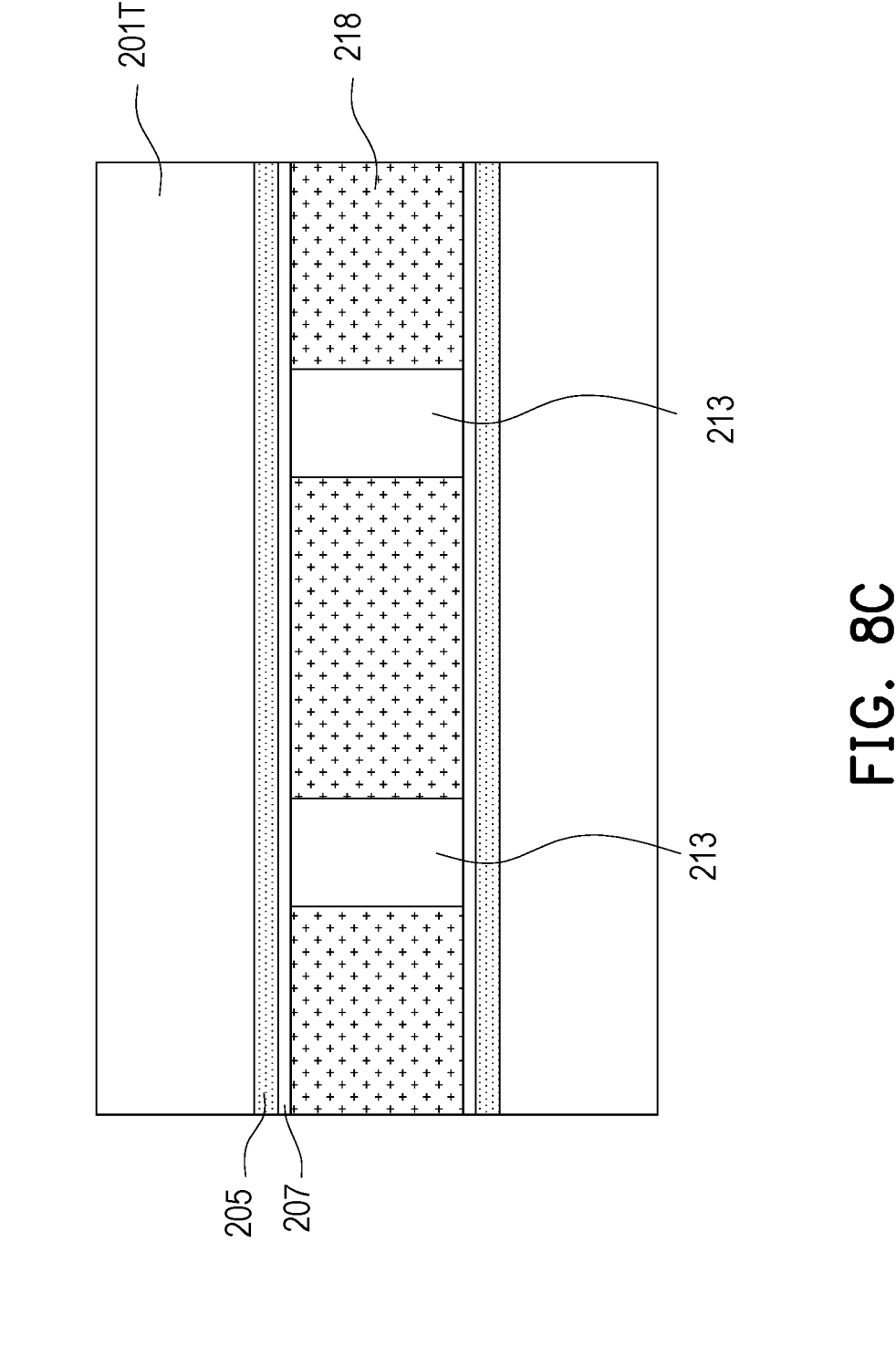
Figure 8D:
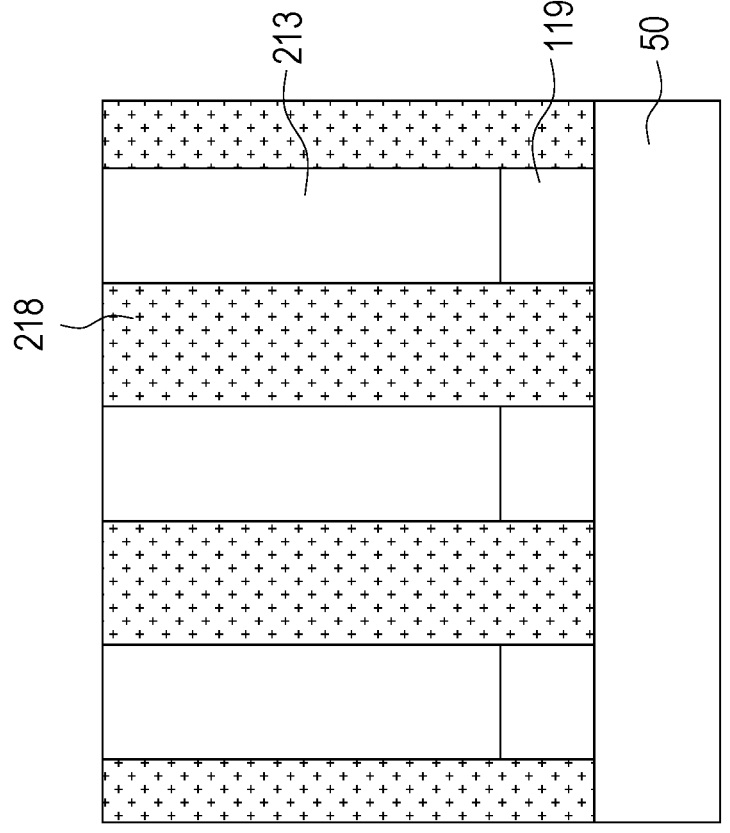
Figure 8D:
Figure 9A:
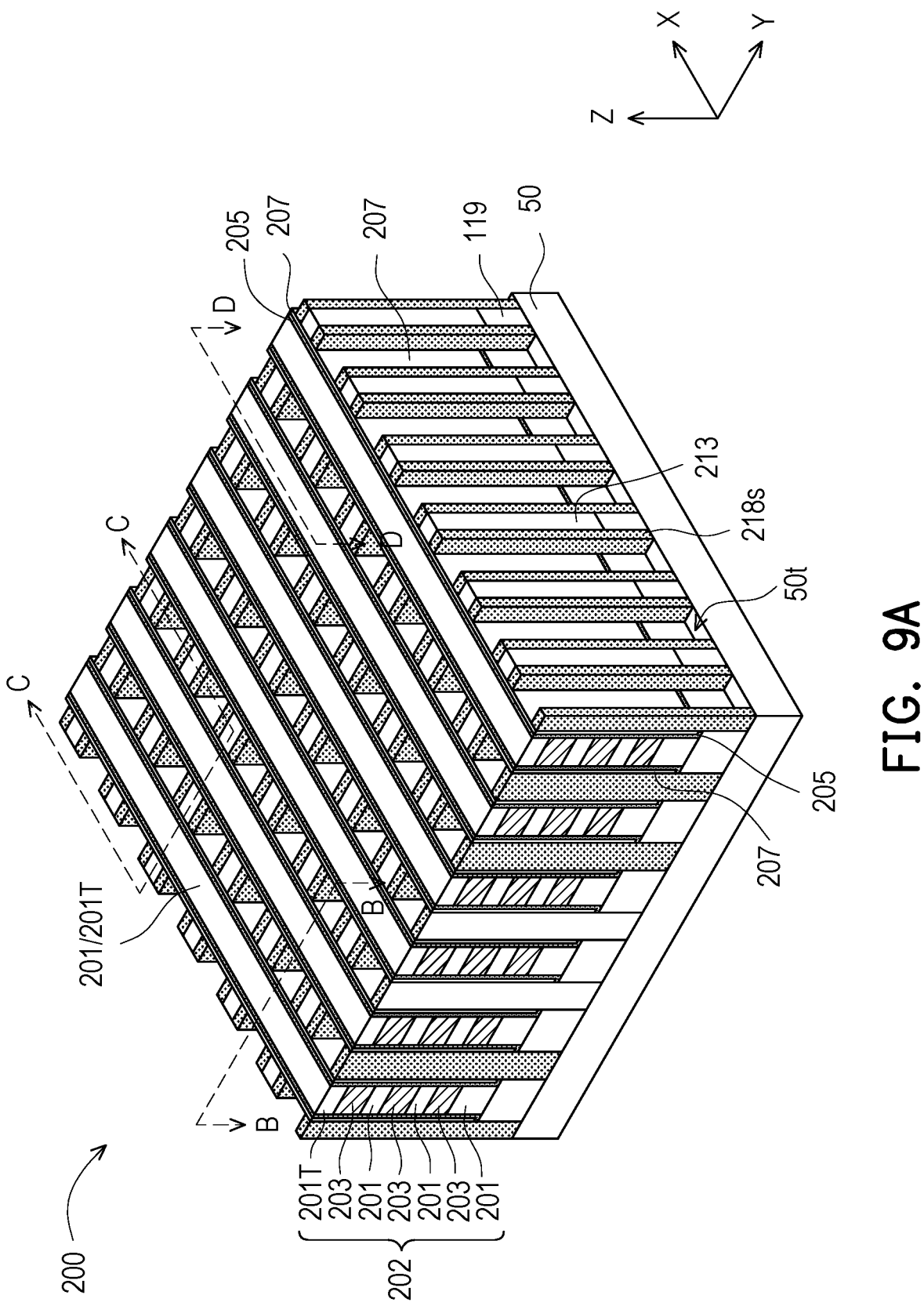
Figure 9B:
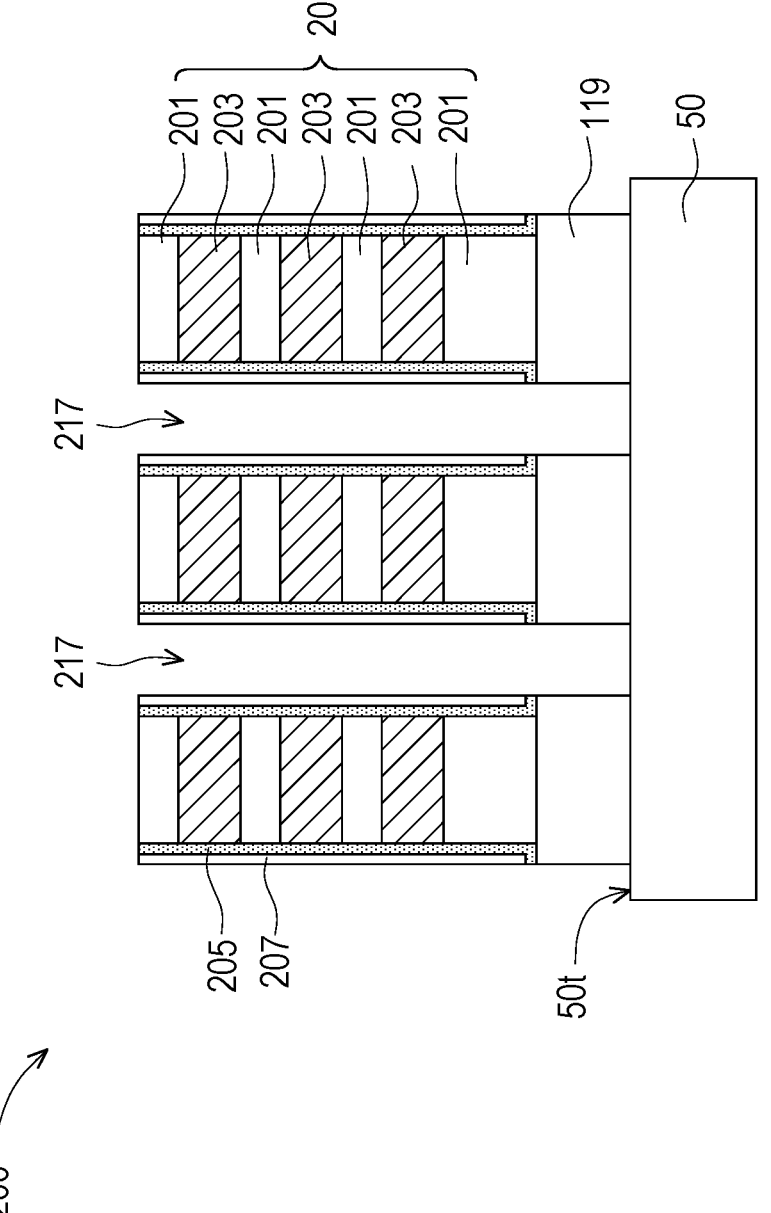
Figure 9C:
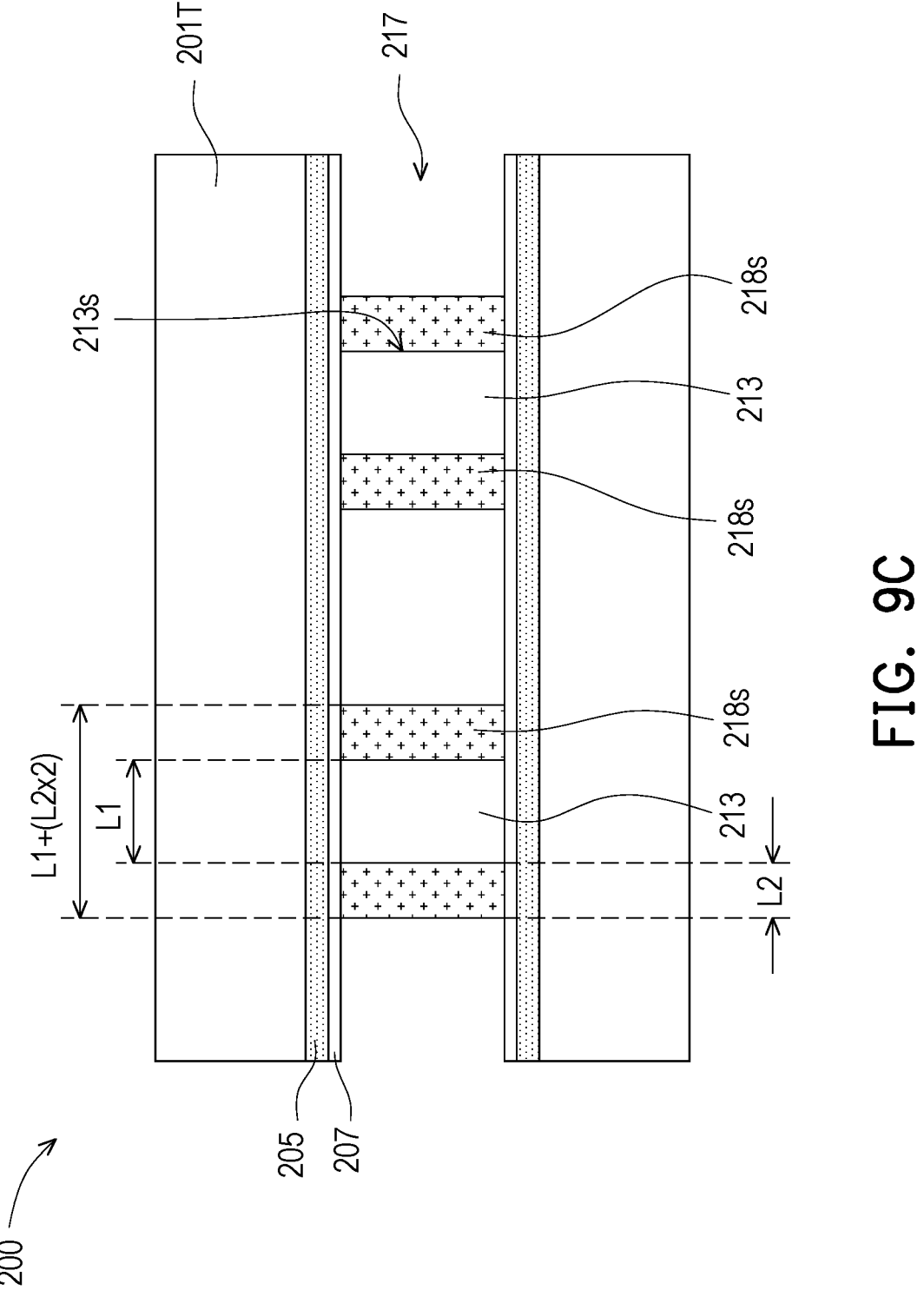
Figure 9D:
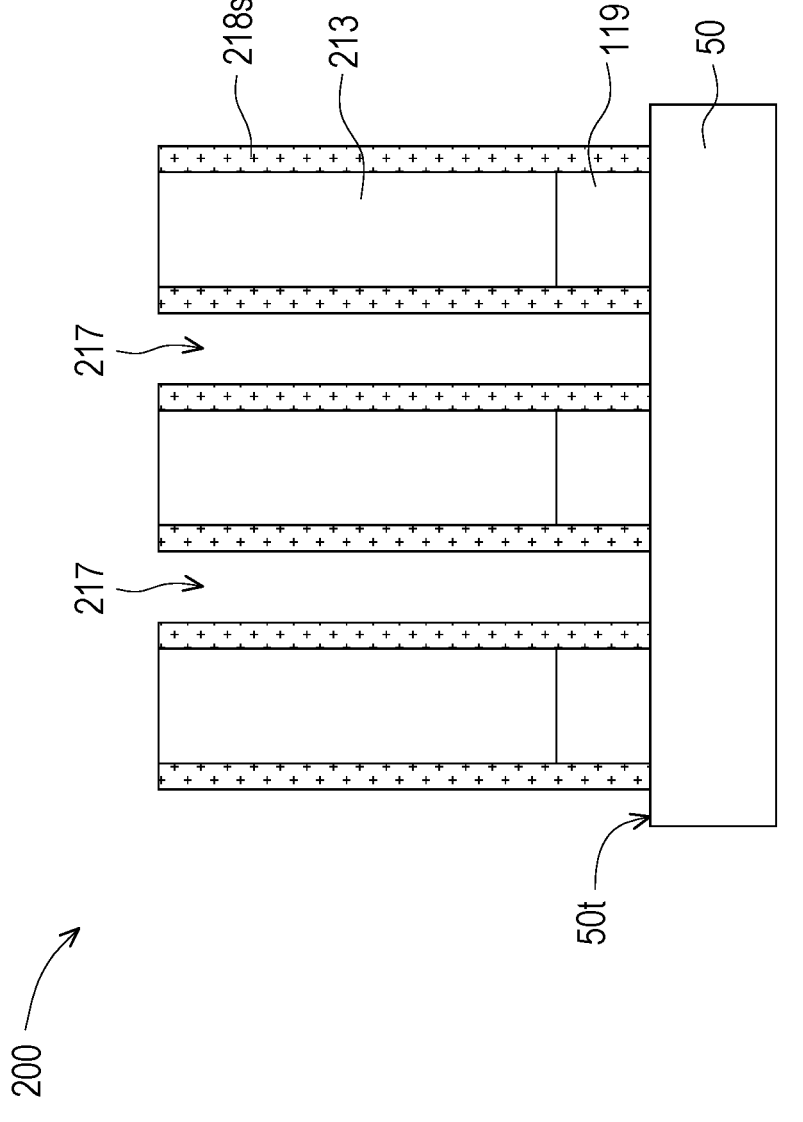
Figure 10A:
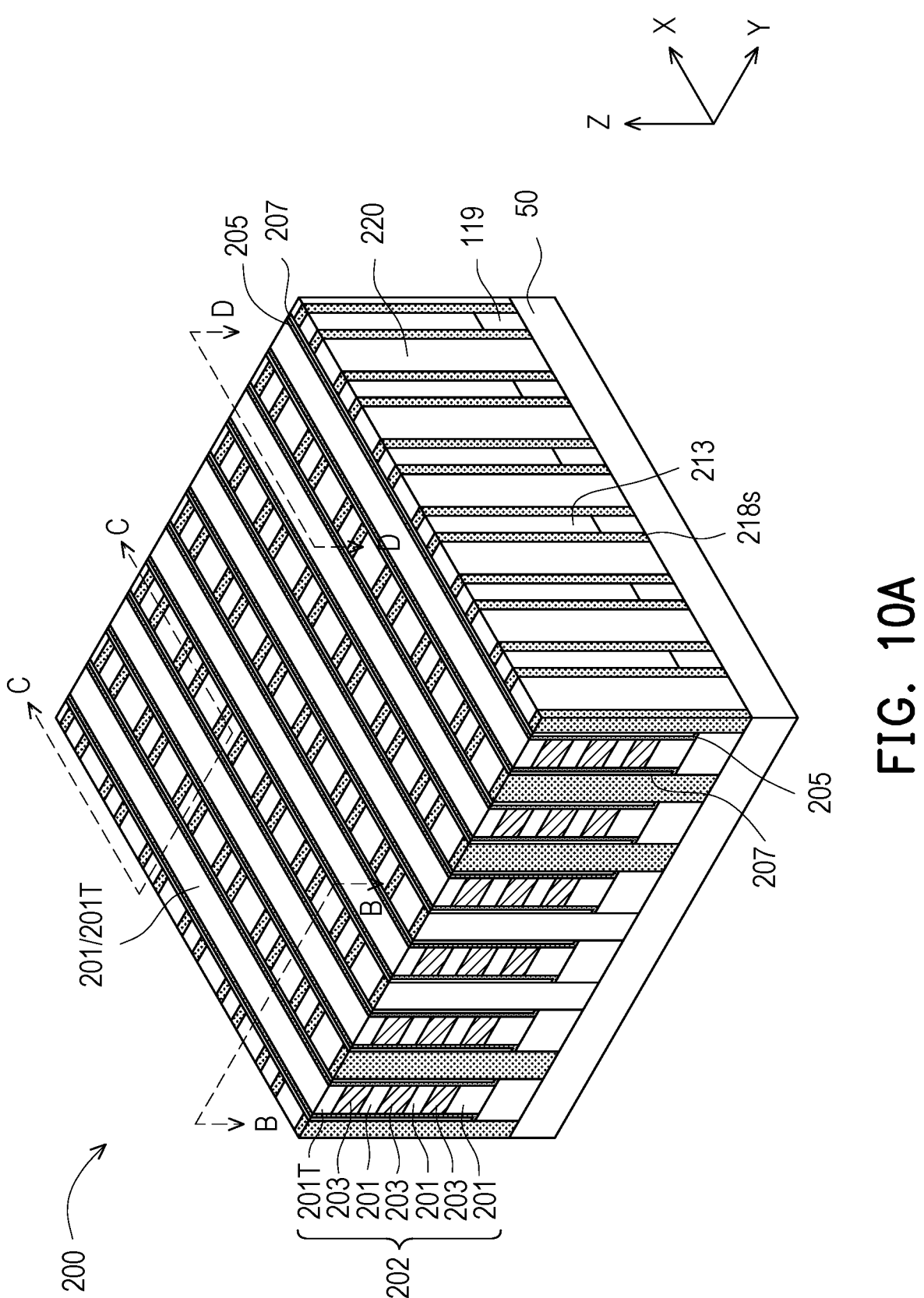
Figure 10B:
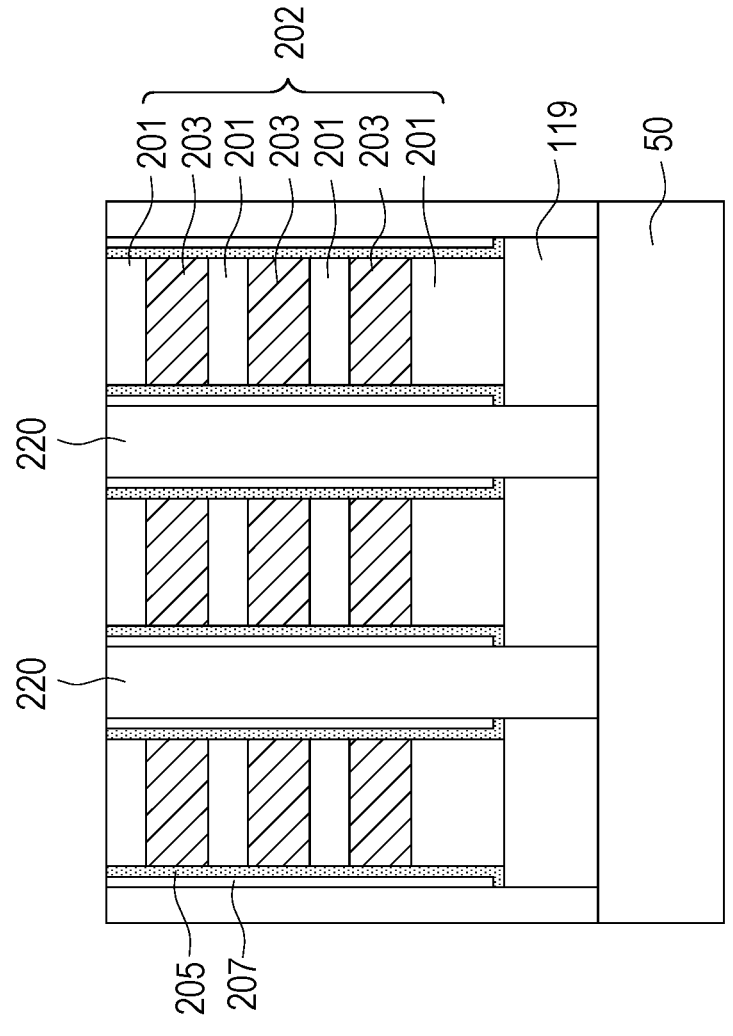
Figure 10C:
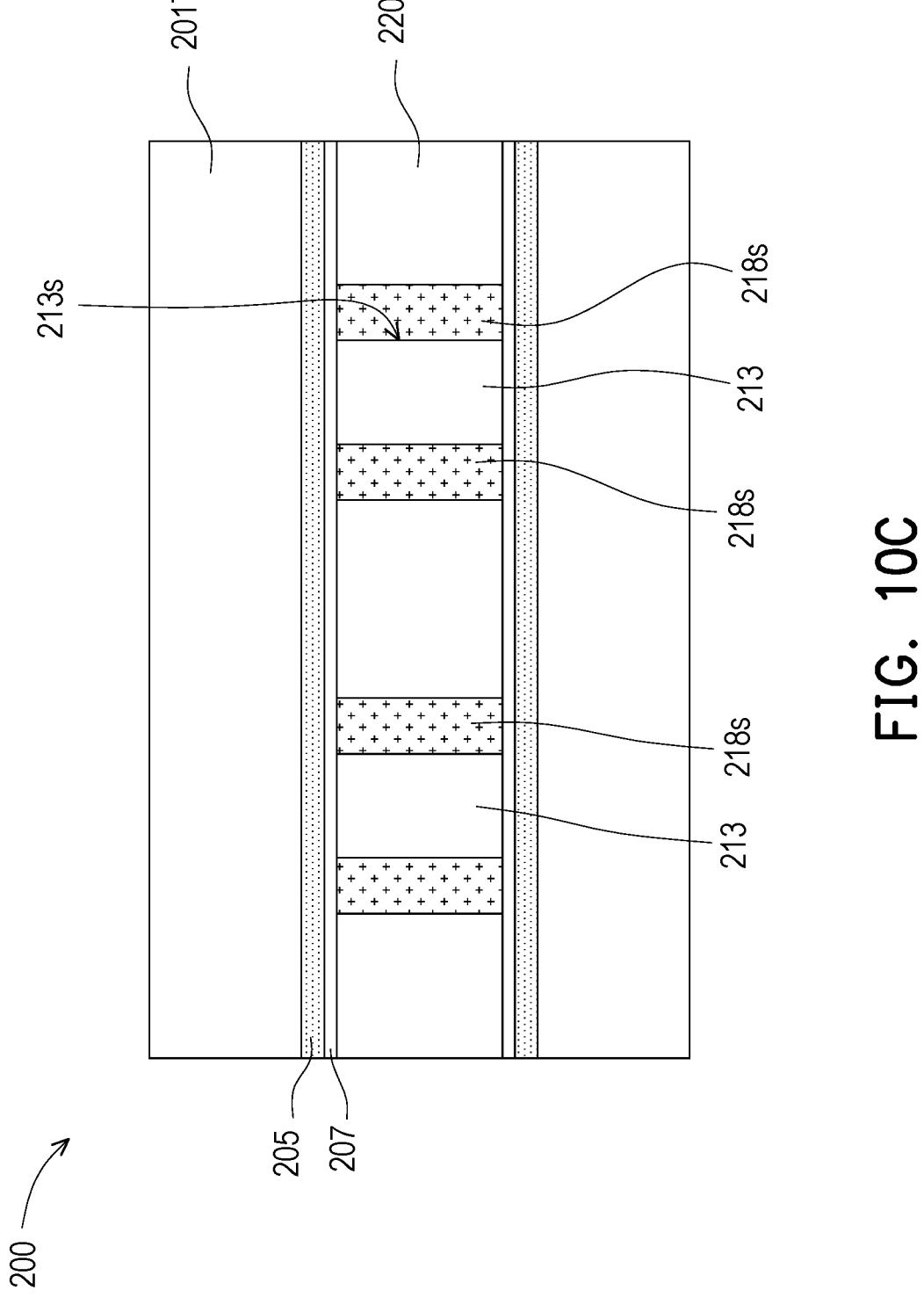
Figure 10D:
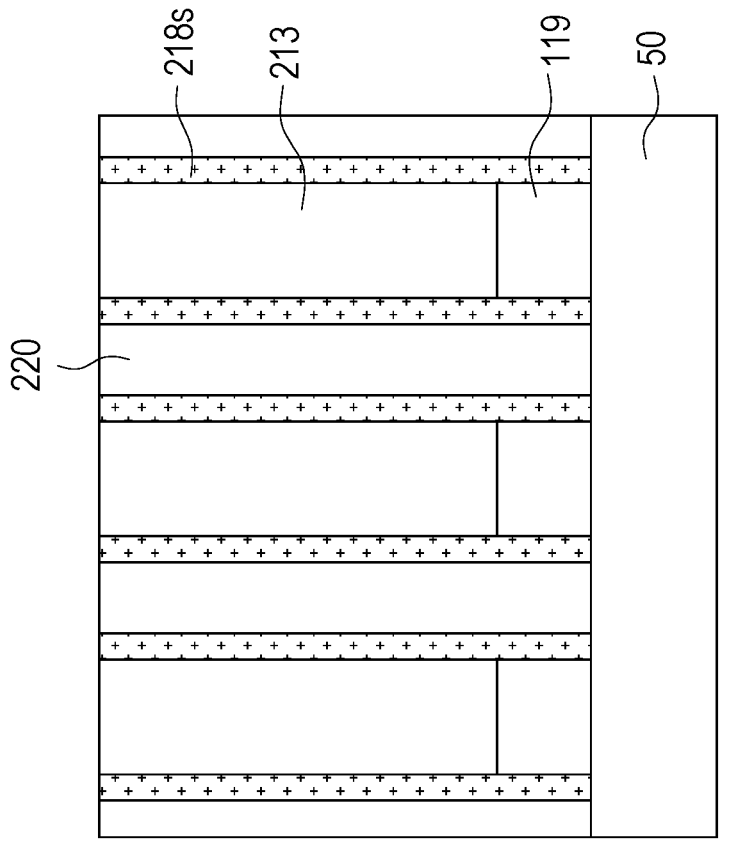
Figure 11A:
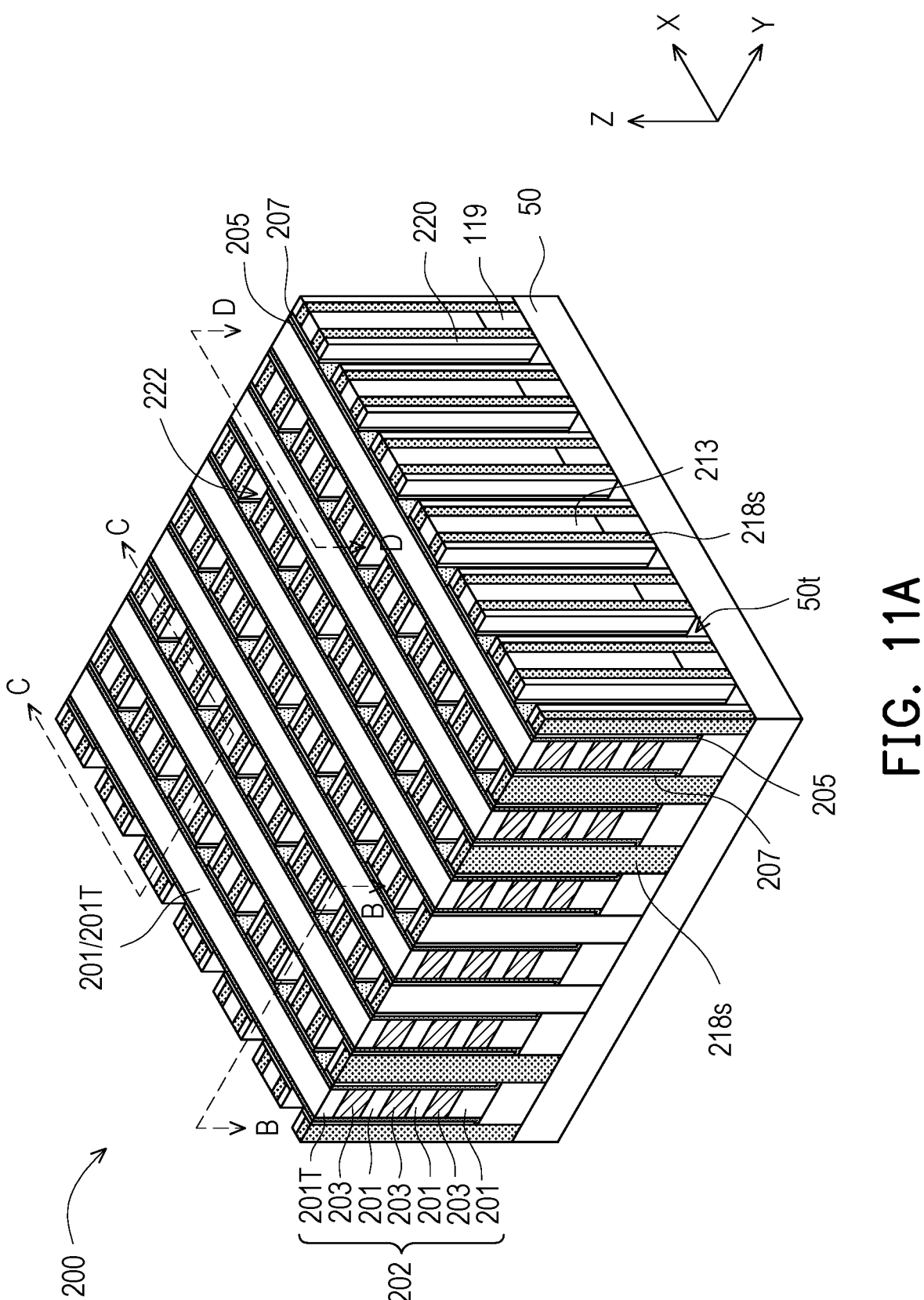
Figure 11B:
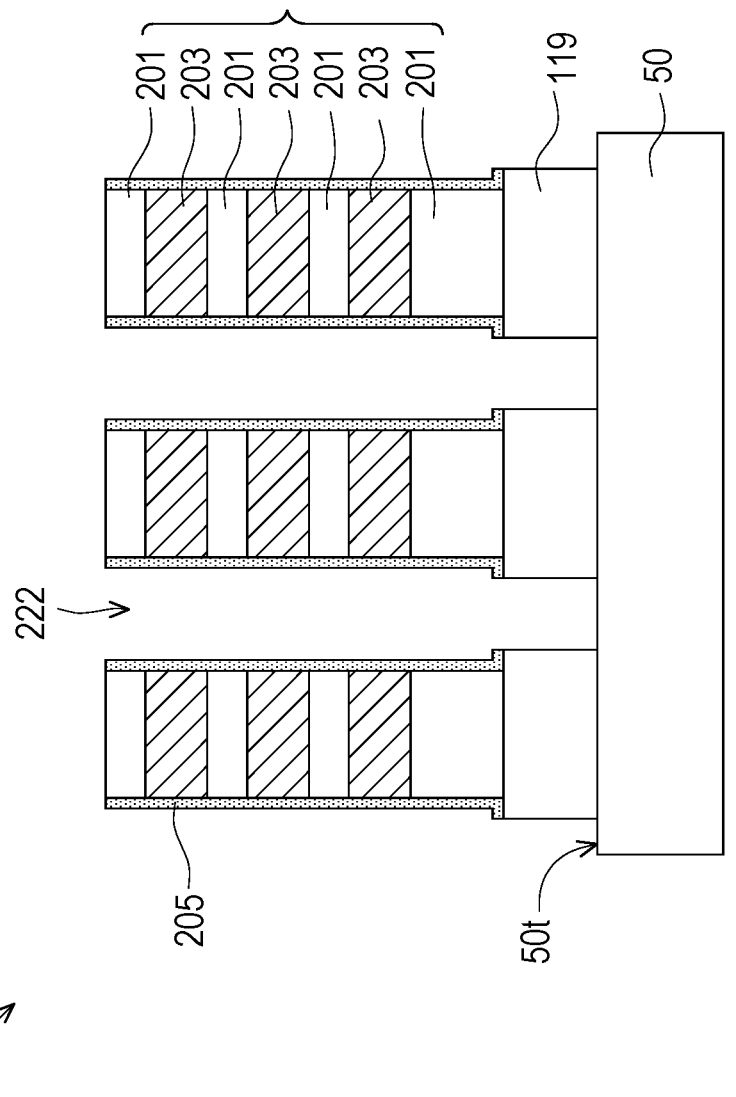
Figure 11C:
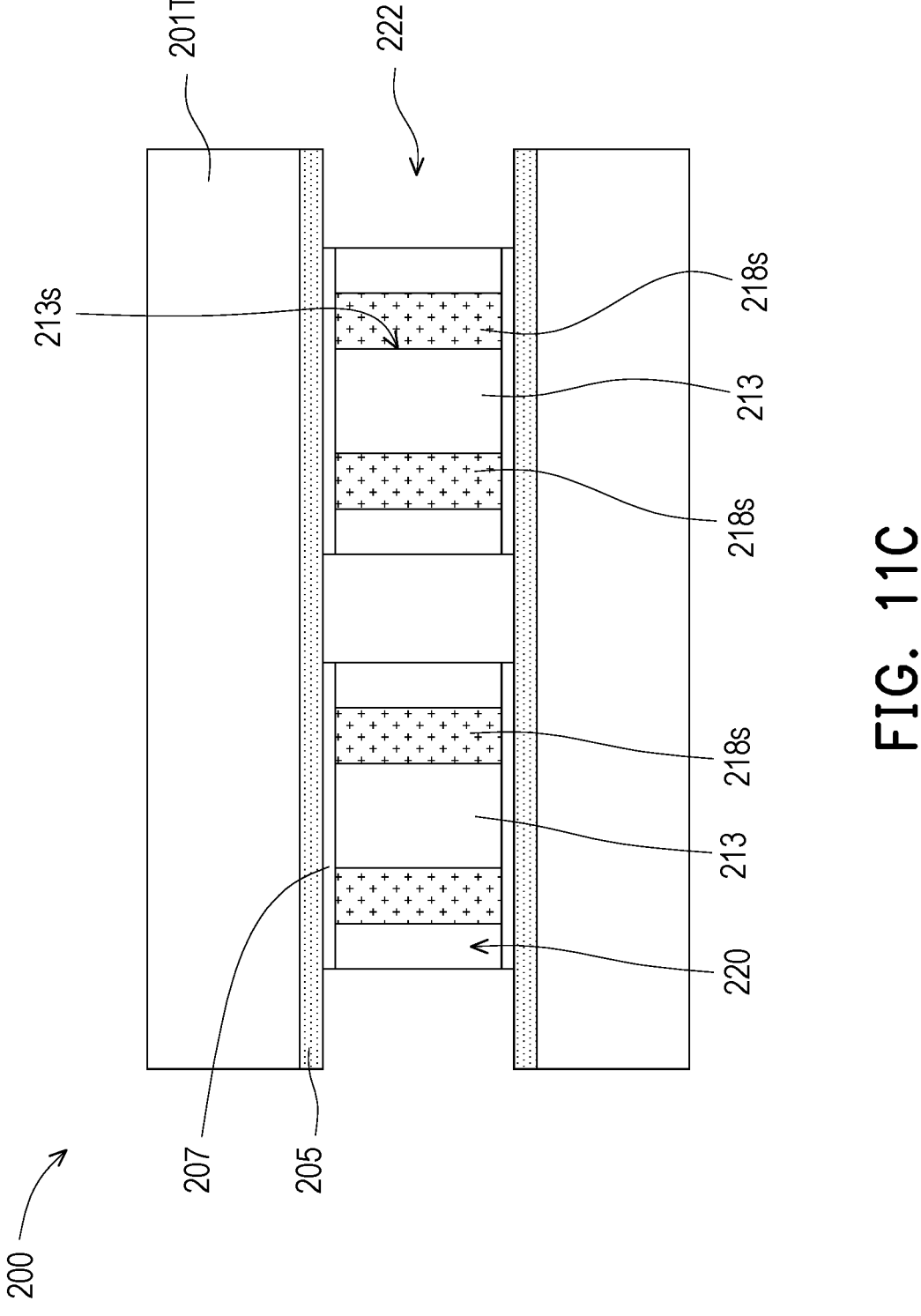
Figure 11D:
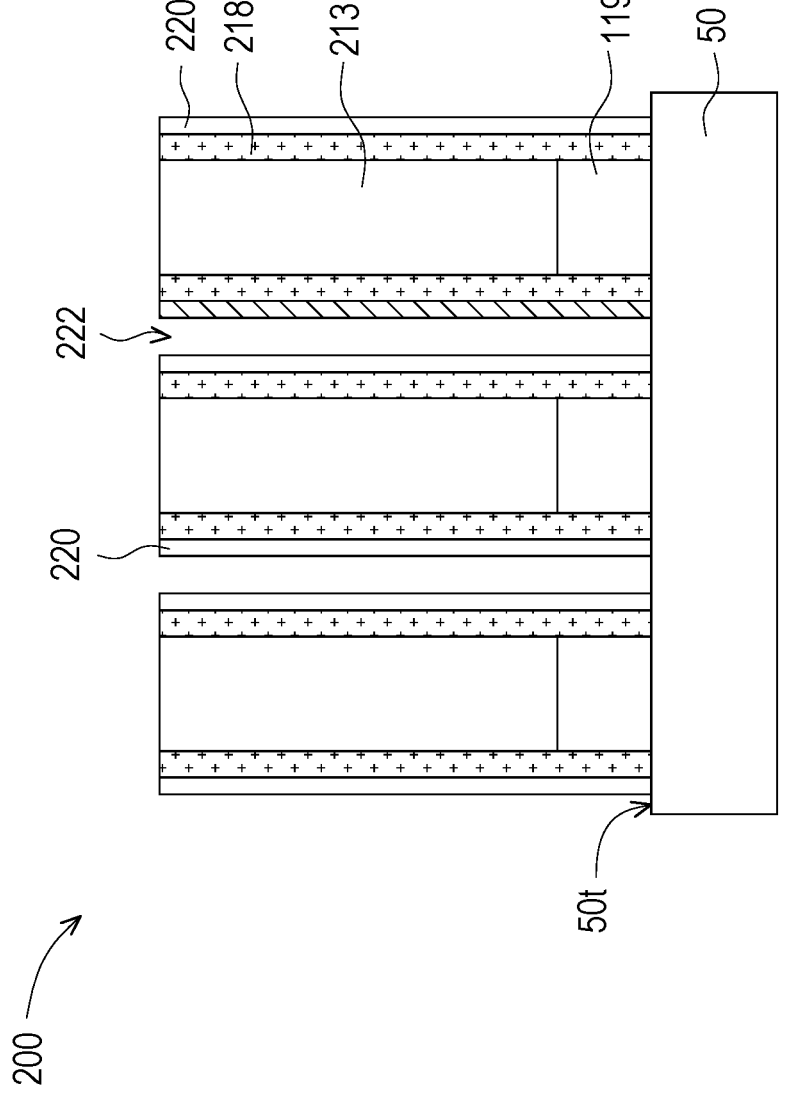

In FIGS. 7A-7D, second trenches 216 are formed in the first oxide material 213 using photolithography and etching processes. The second trenches 216 extend vertically through the first oxide material 213 and the exposed portions of the ESL 119 to expose a top surface 50t of the substrate 50. The second trenches 216 also expose portions of the ferroelectric layer 205, the channel layer 207, the ESL 119, and the top surface 50t of the substrate 50 within the second trenches 216. An etch mask (not shown) may be formed on the FeRAM device 200 and be used during the etching process. The etch mask may be a patterned photoresist layer having a plurality of openings formed by the photolithography process. The patterned photoresist layer covers the topmost dielectric layers 201T and portions of the first oxide material 213, while the openings in the patterned photoresist layer expose portions of the first oxide material 213. An anisotropic etch process is then performed to remove the exposed portions of the first oxide material 213 using the patterned photoresist layer as an etch mask. The etchant used during the etch process is selective to the first oxide material 213 and the ESL 119 but does not substantially affect the ferroelectric layer 205, the channel layer 207, and the substrate 50. The etch mask is then removed. As a result of the etch process, the second trenches 216 are formed through the entire thickness of the first oxide material 213 and the ESL 119, leaving fin-like structures of the first oxide material 213 extended along the Y-direction and intersected perpendicularly with the layer stacks 202. As can be seen in FIG. 7A, each of the second trenches 216 is generally defined by two adjacent layer stacks 212 and two adjacent fin-like structures of the first oxide material 213.

In FIGS. 8A-8D, the second trenches 216 are filled with spacer materials 218. Portions of the spacer materials 218 are to be removed during subsequent formation of third trenches 217. The spacer materials 218 fill in the second trenches 216 and are in contact with the exposed surfaces of the first oxide material 213, the ferroelectric layer 205, the channel layer 207, the ESL 119, and the substrate 50. The spacer materials 218 may overfill the second trenches 216 and may be formed over the upper surface of the layer stack 202. Next, a planarization process, such as CMP, is performed to remove excess portions of the spacer materials 218 from the upper surface of the layer stack 202. The planarization process may be performed until the topmost dielectric layer 201T is exposed. After the planarization process, the top surfaces of the topmost dielectric layer 201T, the ferroelectric layer 205, the channel layer 207, the first oxide material 213, and the spacer material 218 are substantially co-planar.

In various embodiments, the spacer materials 218 include or are made of metal oxides or semiconductor materials. For example, the metal oxides may be p-type or n-type metal oxides or p-type or n-type silicon materials, depending on the conductivity type of the channel layer 207. In some embodiments, the spacer materials 218 have a conductivity type that is opposite to the conductivity type of the channel layer 207. For FeRAMs using a n-type metal oxide channel layer 207, the spacer materials 218 may use p-type metal oxides, such as NiO, $Cu_2O$, $CuAlO_2$, $CuGaO_2$, $CuInO_2$, $SrCu_2O_2$, SnO, or the like, or p-type semiconductor materials, such as p-doped silicon. For FeRAMs using a p-type metal oxide channel layer 207, the spacer materials 218 may use n-type metal oxides, such as IGZO, ZnO, $In_2O_3$, $SnO_3$, or the like, or n-type semiconductor materials, such as n-doped silicon. The spacer materials 218 may be deposited by any suitable deposition technique such as PVD, CVD, ALD, or the like.

In FIGS. 9A-9D, third trenches 217 are formed in the spacer materials 218 using photolithography and etching processes. The third trenches 217 are formed by removing portions of the spacer materials 218. The third trenches 217 extend vertically through portions of the spacer materials 218 to reveal the top surface 50t of the substrate 50. The photolithography and etching processes are performed such that portions of the spacer materials 218 remain on sidewalls of the first oxide material 213 and form spacers 218s. During the formation of the spacers 218s, an etch mask (not shown) is deposited over the FeRAM device 200. The etch mask may be a patterned photoresist layer having a plurality of openings formed by the photolithography process. The patterned photoresist layer covers the top surfaces of the topmost dielectric layer 201T, the ferroelectric layer 205, the channel layer 207, the first oxide material 213, and portions of the spacer materials 218 on opposite sides of the first oxide material 213. The openings in the patterned photoresist layer expose portions of the spacer materials 218. An anisotropic etch is then performed to remove the exposed portions of the spacer materials 218 using the patterned photoresist layer as an etch mask. The anisotropic etch may use an etchant that is selective to the spacer materials 218 but does not substantially affect the ferroelectric layer 205, the channel layer 207, and the substrate 50. The etch mask is removed after the third trenches 217 are formed in the spacer materials 218. As a result of the formation of the third trenches 217, the spacers 218 are formed on sidewalls 213s of the first oxide material 213, and portions of the ferroelectric layer 205, the channel layer 207, the ESL 119, and top surface 50t of the substrate 50 are exposed through the third trenches 217.

Each fin-like structure of the first oxide material 213 may have a length L1 and the spacer 218 may have a length L2 that is larger or lesser than the length L1. The length L1 of the first oxide material 213 and the length L2 of the spacers 218 on opposite sidewalls 213s of the first oxide material 213 define the channel region of the FeRAM device 200. Particularly, the spacers 218 on opposite sidewalls 213s of the first oxide material 213 extends the channel region of the FeRAM device 200 from a first channel length equal to the length L1 to the actual channel length equal to L1+(L2×2). It should be noted that the length L1 of the first oxide material 213 may vary depending on the breakdown voltage of the material used for the first oxide material 213. Since the conductive spacers 218 are electrically coupled to the source/drain features, the length L1 of the first oxide material 213 is critical to prevent leakage between the conductive spacers 218. Therefore, the length L1 of the first oxide material 213 should be the length enough to avoid leakage through the first oxide material 213. If the length L1 is too short, the first oxide material may breakdown easily and cause leakage through the first oxide material 213. In some embodiments, the length L1 and the length L2 may have a ratio (L1:L2) of about 1:2 to about 5:1, for example about 2:1. In some embodiments, the length L1 of the first oxide material 213 may be in a range of about 20 nm to about 50 nm, for example about 30 nm. However, larger or lesser length L1 may be used, depending on the size of the FeRAM device 200.

The conductive spacers 218 extend the source/drain fringing field into channel region and enhance the fringing electric field (from the subsequent source/drain features) in the ferroelectric layer 205. In conventional FeRAM devices, an inter-layer dielectric may be inserted in the channel region. Portions of the inter-layer dielectric extend into source/drain features to form over-hang source/drain contact. These over-hang source/drain contacts maintain the proper channel length while providing coupling electric field needed in the ferroelectric layer for electrical polarization. However, the use of the inter-layer dielectric may consume applied electric field, resulting in a smaller polarization in the over-hang source/drain contacts than that of the source/drain features. With the spacers 218s, the inter-layer dielectric as often used in the conventional FeRAM devices can be omitted. The spacers 218s serve as a source to provide additional hole carriers (positive charges) to the channel layer 207 which attract the electrons (negative charges) formed at gate electrode (e.g., electrically conductive materials 203 in the layer stack 202) when an external negative voltage is applied to the gate electrode. As a result, the coupling electric field in the ferroelectric layer 205 is enhanced, allowing a full polarization switching in the ferroelectric layer 205 during the program and erase operations. An enhanced coupling electric field also leads to a wider memory window (i.e., a difference between readout currents when the ferroelectric layer 205 is respectively at program and erase states) and a prominent voltage drop in the ferroelectric layer 205, which increases the erase efficiency during the erase operation for FeRAM devices using oxide semiconductor as a channel material.

In FIGS. 10A-10D, the third trenches 217 are filled with a sacrificial layer 220. The sacrificial layer 220 may be formed of silicon oxide, silicon oxynitride, silicon nitride, or any suitable material that can provide etch selectivity with respect to the oxide materials 213. The sacrificial layer 220 may be deposited using any suitable deposition technique such as ALD or the like. In cases where the oxide materials 213 include silicon oxide, the sacrificial layer 220 may be silicon nitride. The sacrificial layer 220 may overfill the third trenches 217 and may be formed over the upper surface of the layer stack 202. Next, a planarization process, such as CMP, is performed to remove excess portions of the sacrificial layer 220 from the upper surface of the layer stack 202. The planarization process may be performed until the topmost dielectric layer 201T is exposed. After the planarization process, the top surfaces of the topmost dielectric layer 201T, the ferroelectric layer 205, the channel layer 207, the first oxide material 213, the spacer material 218, and the sacrificial layer 220 are substantially co-planar.

In FIGS. 11A-11D, openings 222 are formed in the sacrificial layer 220 using photolithography and etching processes. The openings 222 are formed by removing portions of the sacrificial layer 220. In some embodiments, exposed portions of the channel layer 207 are also removed during formation of the openings 222. In either case, the openings 222 extend vertically through portions of the sacrificial layer 220 to expose the top surface 50t of the substrate 50. The photolithography and etching processes are performed such that portions of the sacrificial layer 220 remain on sidewalls of the spacers 218s after the formation of the openings 222. To form the openings 222, an etch mask (not shown) is deposited over the FeRAM device 200. The etch mask may be a patterned photoresist layer having a plurality of through openings formed by the photolithography process. The patterned photoresist layer covers the top surfaces of the topmost dielectric layer 201T, the ferroelectric layer 205, the channel layer 207, the first oxide material 213, the spacer 218s, and portions of the sacrificial layer 220 in contact with sidewalls of the spacer 218s. The through openings in the patterned photoresist layer correspond to locations of the openings 222. The openings expose portions of the sacrificial layer 220. An anisotropic etch is then performed to remove the exposed portions of the sacrificial layer 220 and the channel layer 207 using the patterned photoresist layer as an etch mask. The anisotropic etch may use an etchant that is selective to the sacrificial layer 220 and the channel layer 207 but does not substantially affect the ferroelectric layer 205 and the substrate 50. The etch mask is removed after the openings 222 are formed in the sacrificial layer 220. As a result of the formation of the openings 222, the sacrificial layer 220 is formed on opposite sidewalls of the spacers 218, and portions of the ferroelectric layer 205, the ESL 119, and top surface 50t of the substrate 50 are exposed through the openings 222. Particularly, the remaining channel layer 207 (which was covered by the patterned photoresist layer) is disposed between and in contact with the ferroelectric layer 205 on a first side of the channel layer 207 and the oxide material 213, the spacers 218s, and the sacrificial layers 220 on a second side of the channel layer 207.

Figure 12A:
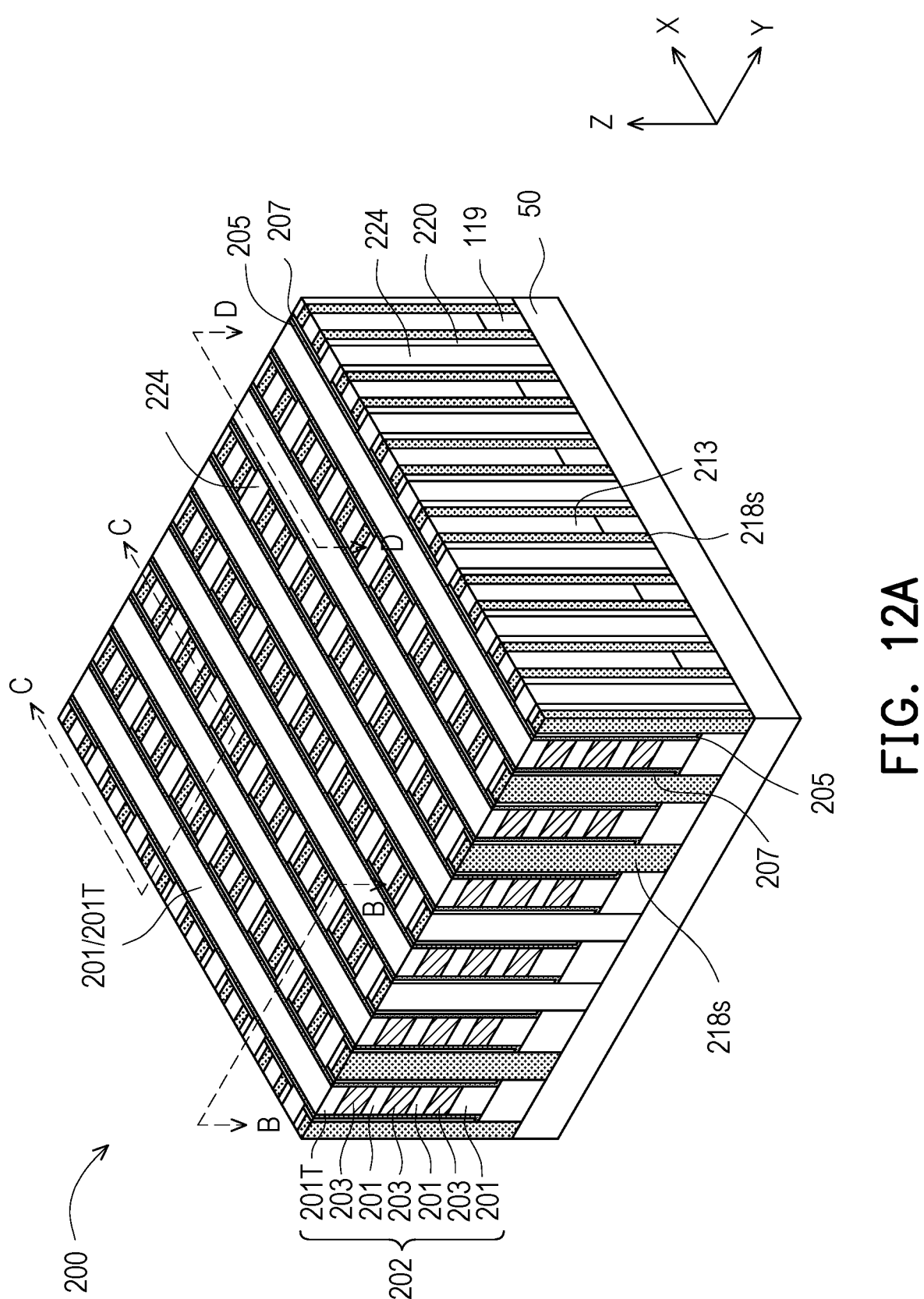
Figure 12B:
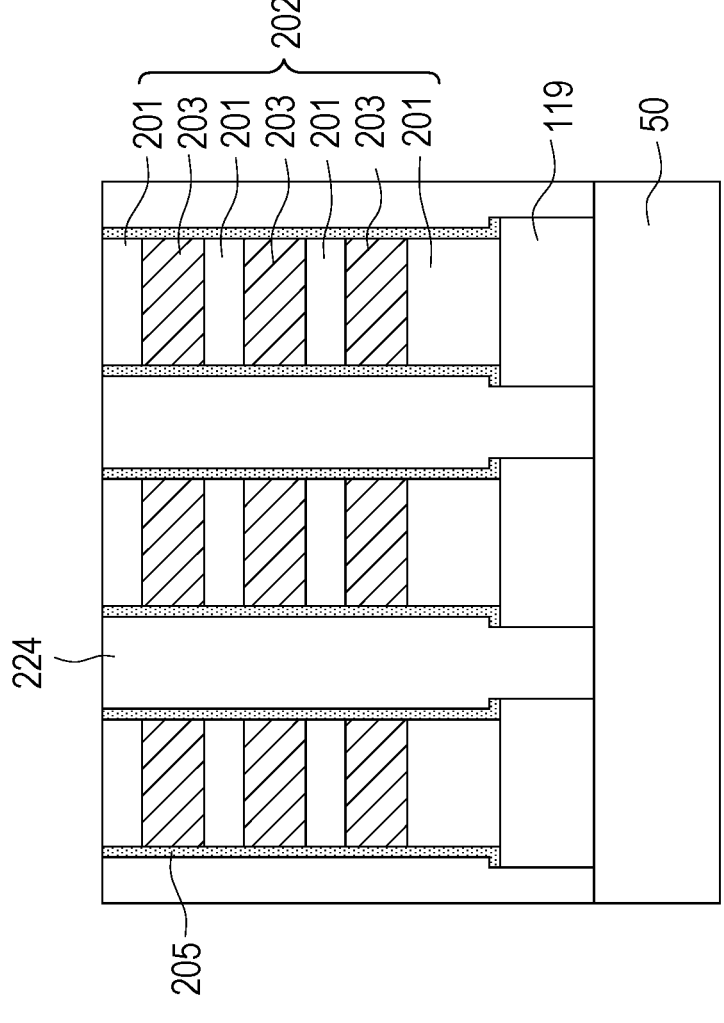
Figure 12C:
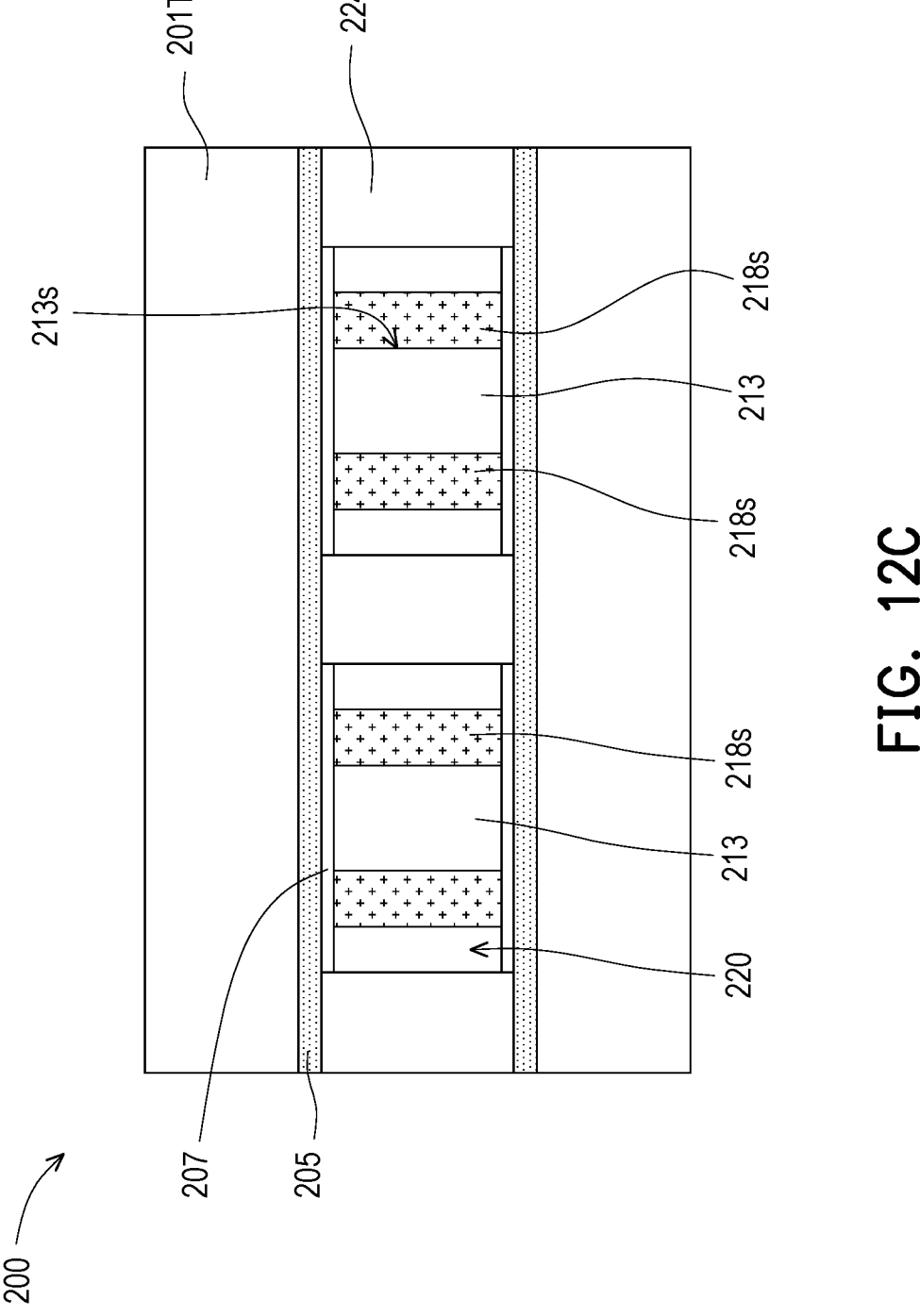
Figure 12D:
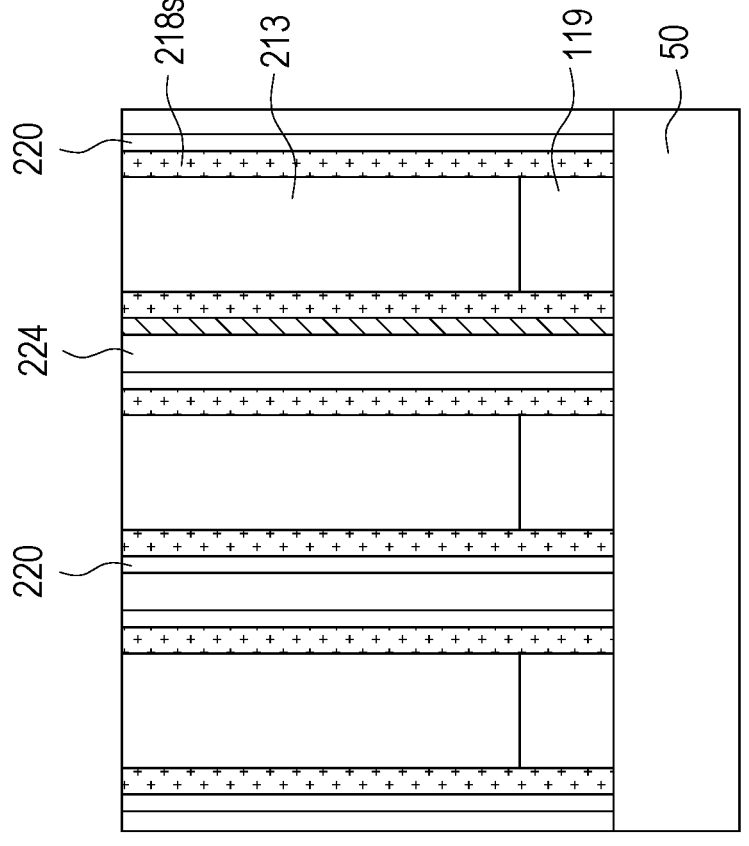
Figure 13A:
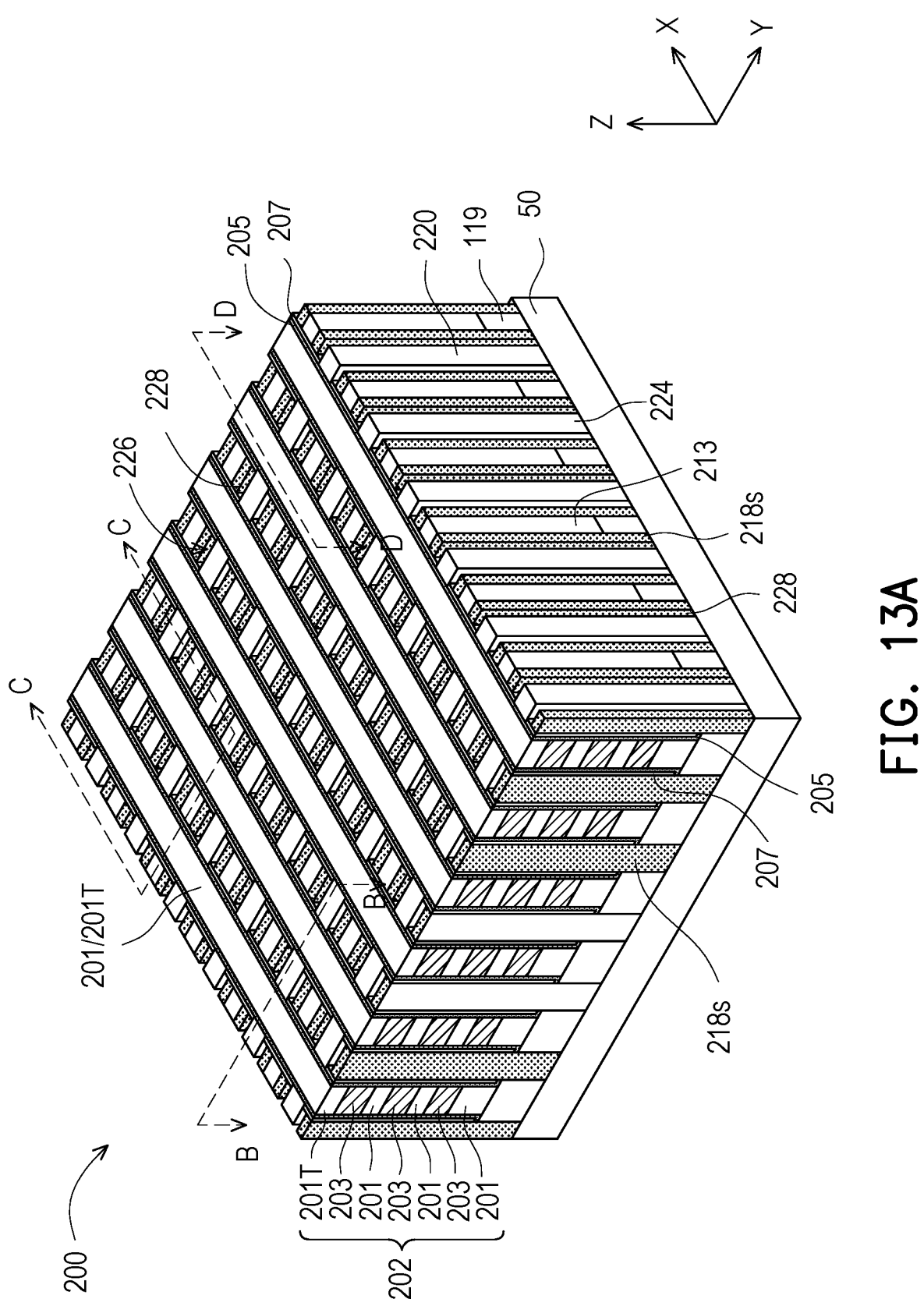
Figure 13B:
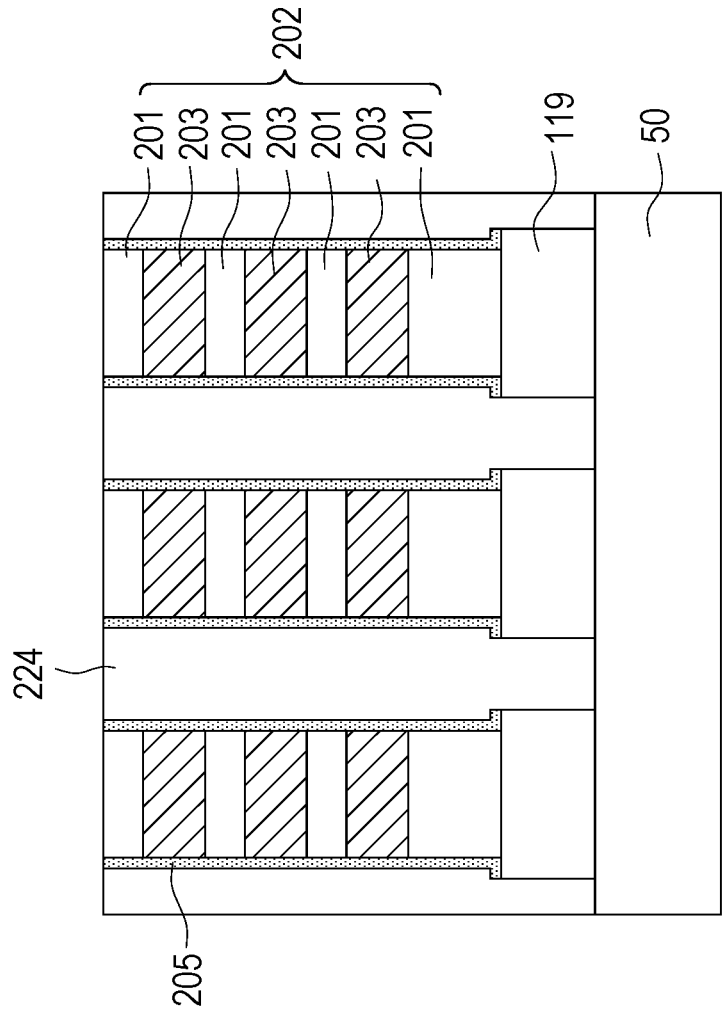
Figure 13C:
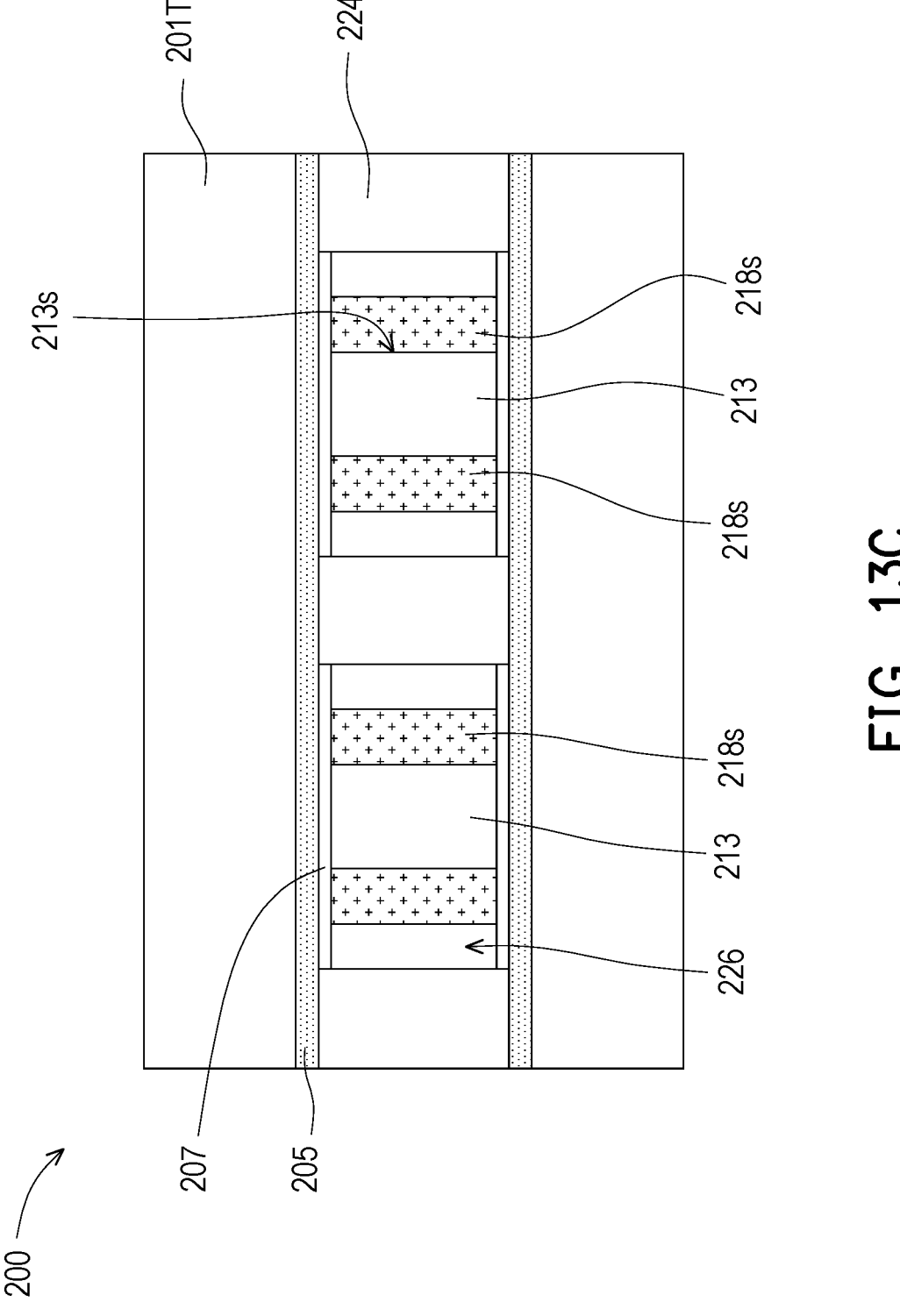
Figure 13D:
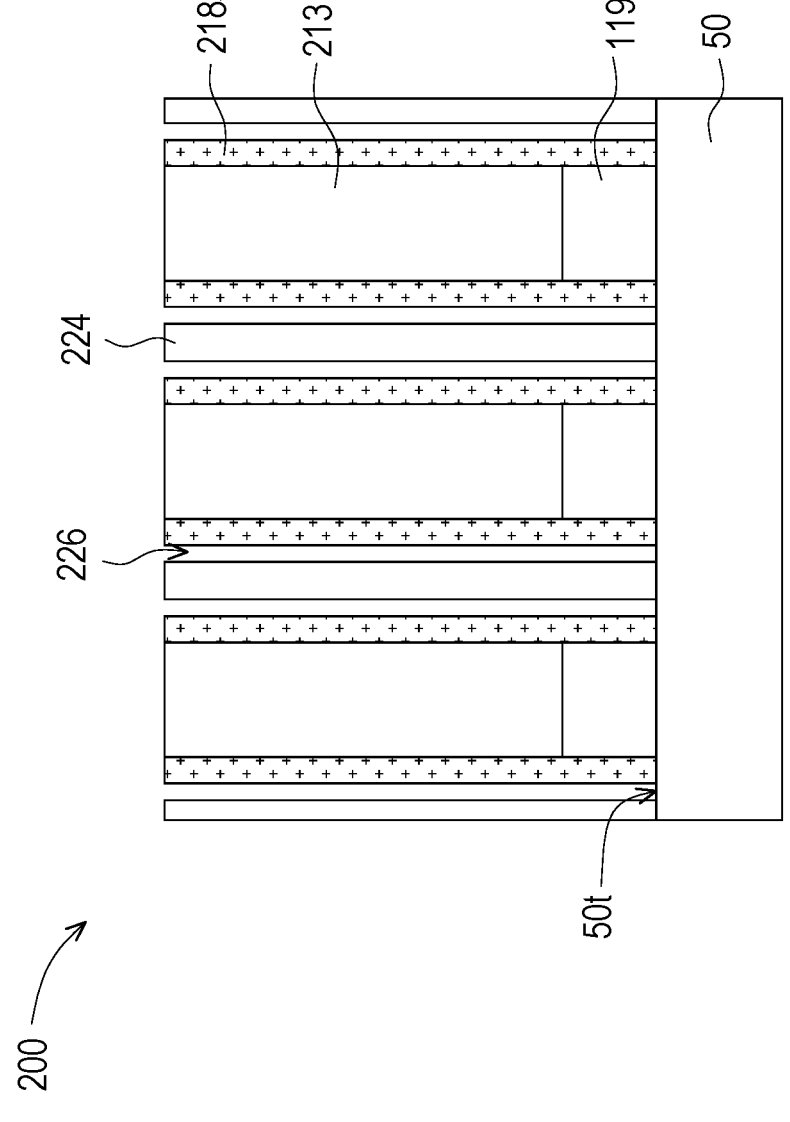

In FIGS. 12A-12D, the openings 222 are filled with a second oxide material 224. The second oxide material 224 may include the same material as the first oxide material 213, and be deposited using the same deposition technique as the first oxide material 213. In one embodiment, the second oxide material is silicon oxide. The second oxide material 224 fills in the isolation region 222 and in contact with the sacrificial layer 220, the ferroelectric layer 205, the channel layer 207, the ESL 119, and the top surface 50t of the substrate 50. The second oxide material 224 may overfill the openings 222 and may be formed over the upper surface of the layer stack 202. Next, a planarization process, such as CMP, is performed to remove excess portions of the second oxide material 224 from the upper surface of the layer stack 202. The planarization process may be performed until the topmost dielectric layer 201T is exposed. After the planarization process, the top surfaces of the topmost dielectric layer 201T, the ferroelectric layer 205, the channel layer 207, the first oxide material 213, the spacer material 218, and the second oxide material 224 are substantially co-planar. The second oxide material 224 in the openings 222 forms isolation regions 222, which may also be referred to as memory cell isolation regions 222. As can be seen in FIGS. 12B-12D, the second oxide material 224 is in direct contact with the ferroelectric layer 205, and the channel layers 207 are disposed between and in contact with the second oxide material 224. In addition, the first oxide material 213 and the second oxide material 224 are parallel to each other.

In FIGS. 13A-13D, the sacrificial layers 220 are selectively removed using etching processes. Openings 226 are formed as a result of the removal of the sacrificial layers 220. The openings 226 extend vertically from the upper surface of the layer stack 202 facing away from the substrate 50 to the lower surface of the layer stack 202 facing the substrate 50. The openings 226 expose the channel layer 207, the spacers 218s, the second oxide material 224, and the top surface 50t of the substrate 50. The removal of the sacrificial layers 220 may use any suitable etch process, such as a dry etch, a wet etch, or a combination thereof. The etch process may use an etchant that is selective to the sacrificial layer 220 but does not substantially affect the channel layer 207, the spacers 218s, the first oxide material 213, the second oxide material 224, and the substrate 50.

In FIGS. 14A-14D, the openings 226 are filled with an electrically conductive material 228. The electrically conductive material 228 fills the openings 226 and is in contact with the exposed surfaces of the channel layer 207, the spacers 218s, the second oxide material 224, and the top surface 50t of the substrate 50. The electrically conductive material 228 may include Al, Ti, TiN, TaN, Co, Ag, Au, Cu, Ni, Cr, Hf, Ru, W, Pt, or the like. In some embodiments, the electrically conductive material 228 may include one or more layers of electrically conductive material. In such cases, an optional barrier layer may be formed conformally in the openings 226, followed by the electrically conductive material 228. The barrier layer is formed to contact the exposed surfaces of the channel layer 207, the spacers 218s, the second oxide material 224, and the top surface 50t of the substrate 50. The barrier layer may include titanium nitride, tantalum nitride, titanium tantalum, or the like, and may be formed by CVD, ALD, or other suitable deposition techniques. In either case, a planarization process, such as CMP, may be performed to remove excess portions of the barrier layer (if used) and the electrically conductive material 228 from the upper surface of the layer stack 202. The remaining portions of the barrier layer (if used) and the electrically conductive material 228 in the openings 226 form conductive lines 228s, 228b. The conductive lines 228s, 228b may be in the form of metal columns or metal pillar that extends vertically through the layer stack 202. The conductive lines 228s, 228b serve as source/drain regions may be referred to as source/drain features.

In FIG. 14C, a memory cell 230 is highlighted by a dashed box. The memory cell 230 is a transistor with an embedded ferroelectric layer 205. In the context of memory devices, the electrically conductive material 203 (FIG. 14B) in the memory cell 230 is referred to as the word line (WL) of the memory cell 230, the conductive lines 228s, 228b (e.g., source/drain regions) may be referred to as the source line (SL) and the bit line (BL) of the memory cell 230, and the first oxide material 213 and spacers 218 between the source/drain regions functions as the channel region. Each of the electrically conductive material 203 (e.g., WL) of the FeRAM device 200 electrically connects multiple memory cells formed along a same horizontal plane. In addition, each SL or BL of the FeRAM device 200 electrically connects multiple vertically stacked memory cells (e.g., memory cell 230). Therefore, the 3D FeRAM device 200 achieves efficient sharing of the WLs, BLs, and SLs among multiple memory cells, and the 3D structure of the memory cells allow for multiple layers of the memory cells to be stacked together to form high density memory arrays.

Still referring to FIG. 14C, the first oxide material 213 has a first sidewall 213-1, a second sidewall 213-2 opposing the first sidewall 213-1, a third sidewall 213-3 and a fourth sidewall 213-4 opposing the third sidewall 213-3, wherein the first and second sidewalls 213-1 and 213-2 are in contact with portions of the channel layers 207, and the third and fourth sidewalls 213-3 and 213-4 are in contact with the spacers 218s. Likewise, the conductive lines 228 (e.g., source/drain feature 228s) has a first sidewall 228-1, a second sidewall 228-2 opposing the first sidewall 228-1, a third sidewall 228-3 and the fourth sidewall 228-4 opposing the third sidewall 228-3, wherein the first and second sidewalls 228-1 and 228-2 are in contact with portions of the channel layers 207, the third sidewall 228-3 is in contact with the spacer 218s, and the fourth sidewall 228-4 are in contact with the second oxide material 224. The second oxide materials 224 are in contact with the portions of the ferroelectric layers 205, the channel layer 207, and the conductive lines 228 (e.g., source/drain feature 228s, 228b).

During the writing operation of the FeRAM device 200, e.g., when an external voltage is applied at the gate electrode (e.g., electrically conductive material 203 shown in FIG. 14B) of the transistor, the polarization direction of ferroelectric layer 205 is changed. The electrical polarization direction of the ferroelectric layer 205 in the memory cell 230 indicates the digital information (e.g., a "0" or "1") stored in the memory cell, and determines the threshold voltage of the transistor of the memory cell 230. For example, to perform a program/erase operation on a particular memory cell (e.g., memory cell 230), a program/erase voltage is applied across a portion of the ferroelectric layer 205 within the memory cell 230. The write voltage may be applied, for example, by applying a first voltage to the gate electrode (e.g., electrically conductive material 203) of the memory cell 230, and applying a second voltage to the source/drain regions (e.g., source lines 228s and the bit lines 228b). The voltage difference between the first voltage and the second voltage sets the polarization direction of the ferroelectric layer 205. Depending on the polarization direction of the ferroelectric layer 205, the threshold voltage Vt of the corresponding transistor of the memory cell 230 can be switched from a low threshold voltage to a high threshold voltage, or vice versa. The threshold voltage value of the transistor can be used to indicate a bit of "0" or a "1" stored in the memory cell 230.

To perform a read operation on a particular memory cell (e.g., memory cell 230), a read voltage, which is a voltage between the low threshold voltage and the high threshold voltage, is applied to the gate electrode (e.g., electrically conductive material 203). Depending on the polarization direction of the ferroelectric layer 205 (or the threshold voltage of the transistor), the transistor of the memory cell 230 may or may not be turned on. As a result, when a voltage is applied, e.g., between the source/drain regions (e.g., source lines 228s and the bit lines 228b), an electrical current may or may not flow between the source/drain regions. The electrical current may thus be detected to determine the digital bit stored in the memory cell 230.

As discussed above, FeRAM devices employing oxide semiconductor as a channel material have been found difficult to obtain a uniform electric field during erase operation across the ferroelectric layer due to the lack of sufficient hole carriers in the oxide semiconductor. When there are insufficient hole carriers in the oxide semiconductor channel, a negative voltage applied to the gate electrode can only induce low electric field in the ferroelectric layer. Therefore, a full polarization switching in the ferroelectric layer at channel region cannot be triggered, resulting in lower erase efficiency during the erase operation. By providing spacers 218s on opposite sides of the first oxide material 213, the fringing electric field from the source/drain regions (e.g., source lines 228s and the bit lines 228b) is extended into the channel region through spacers 218s, which enhances the fringing electric field in the ferroelectric layer 205. That is, the spacers 218s and the first oxide material 213 disposed between the spacers 218s serve as the channel region of the transistor. Since the spacers 218s provide additional hole carriers (positive charges) to the channel layer 207, which attract the electrons (negative charges) formed at gate electrode (e.g., electrically conductive materials 203 in the layer stack 202) when an external negative voltage is applied to the gate electrode, a full polarization switching can be obtained in the ferroelectric layer 205 during the erase operations. An enhanced fringing electric field also leads to a wider memory window and a prominent voltage drop in the ferroelectric layer 205, which increases the erase effi-ciency during the erase operation for FeRAM device 200.

Figure 14A:
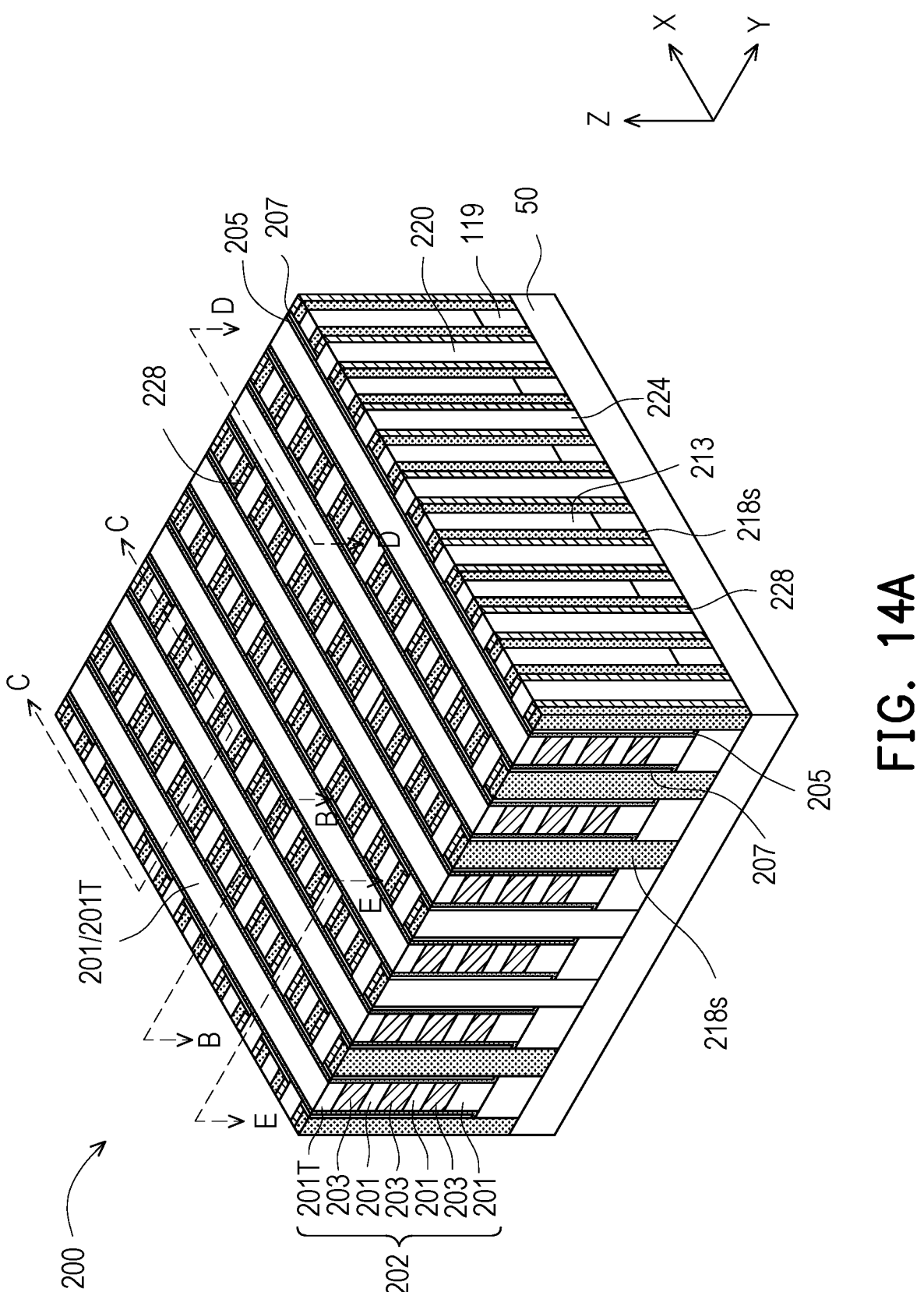
Figure 14B:
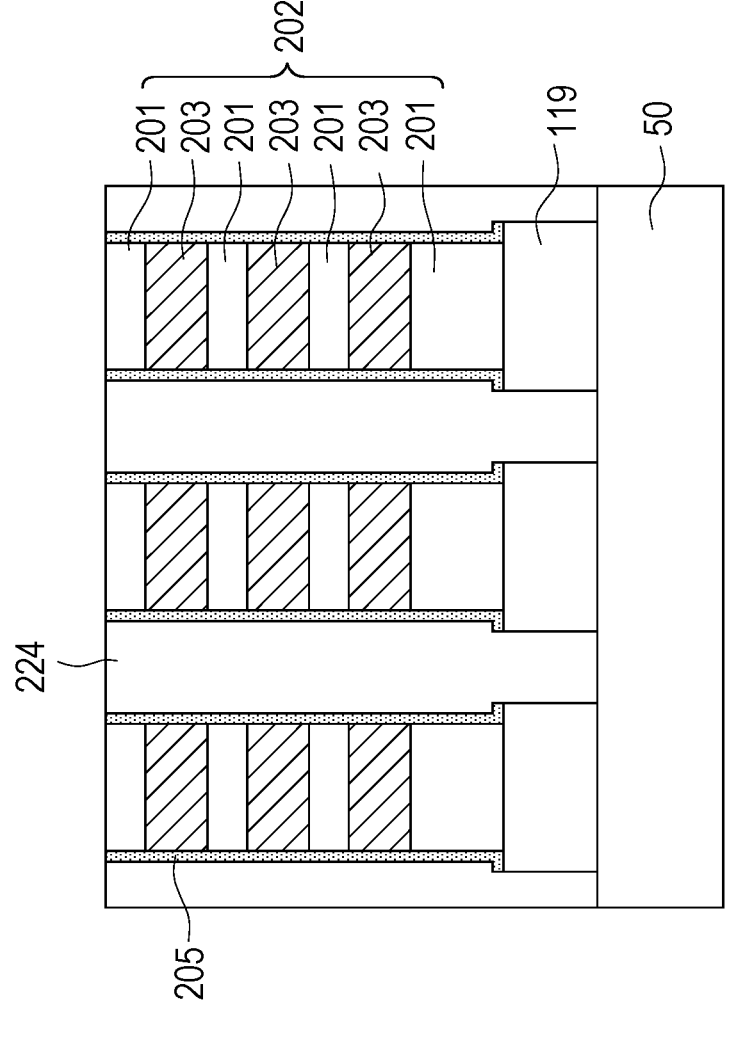
Figure 14C:
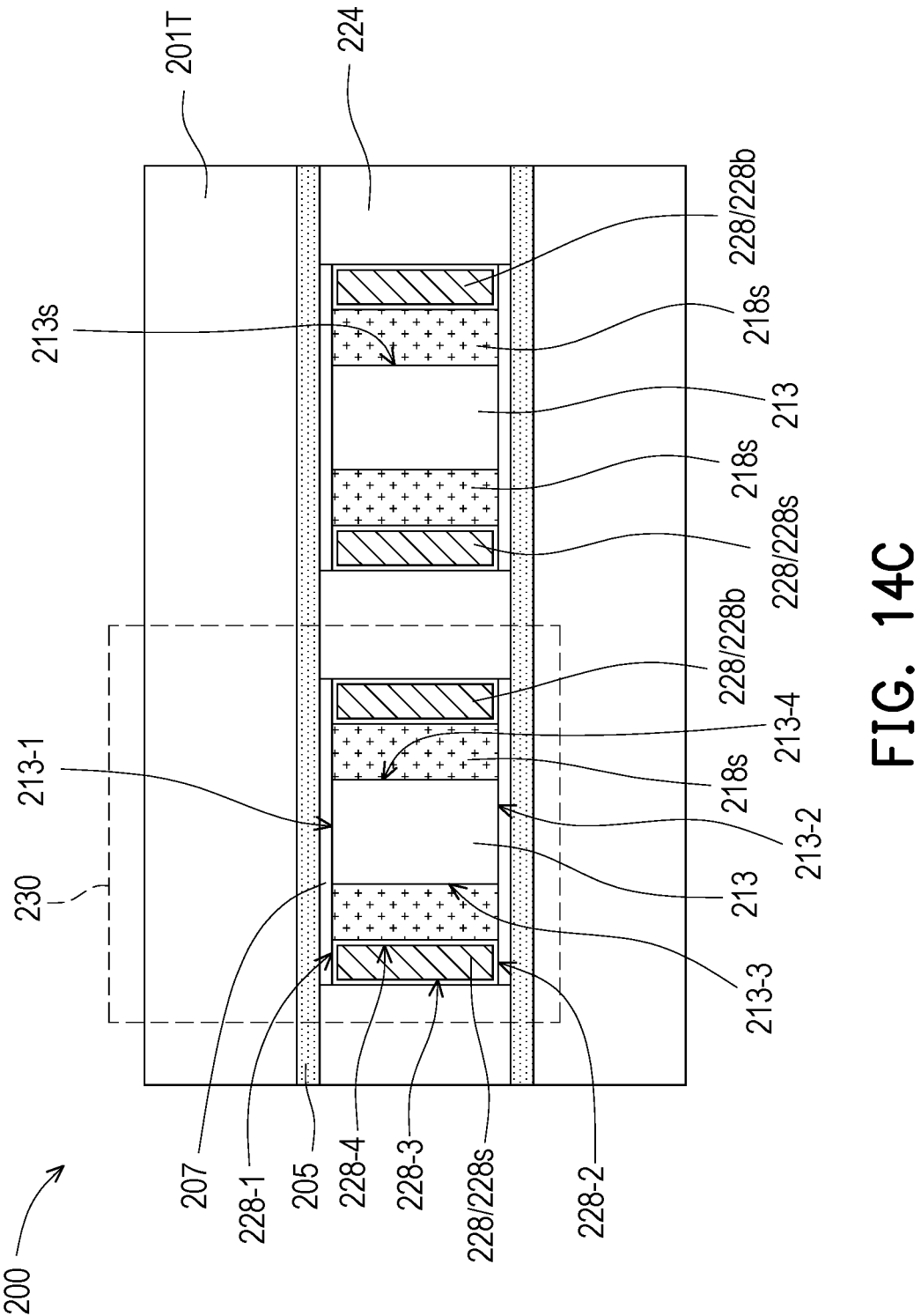
Figure 14D:
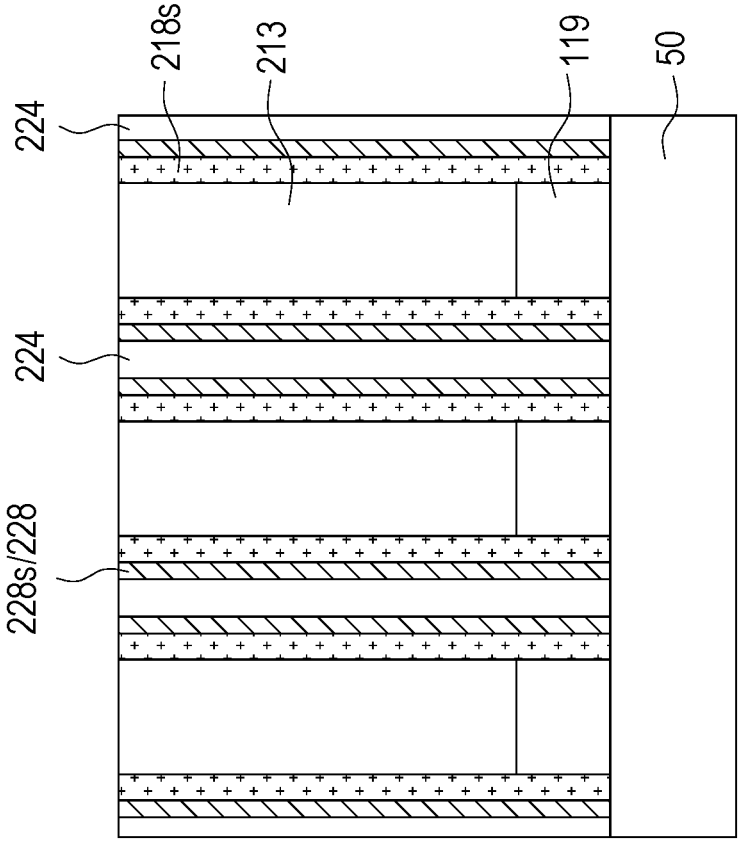
Figure 14E:
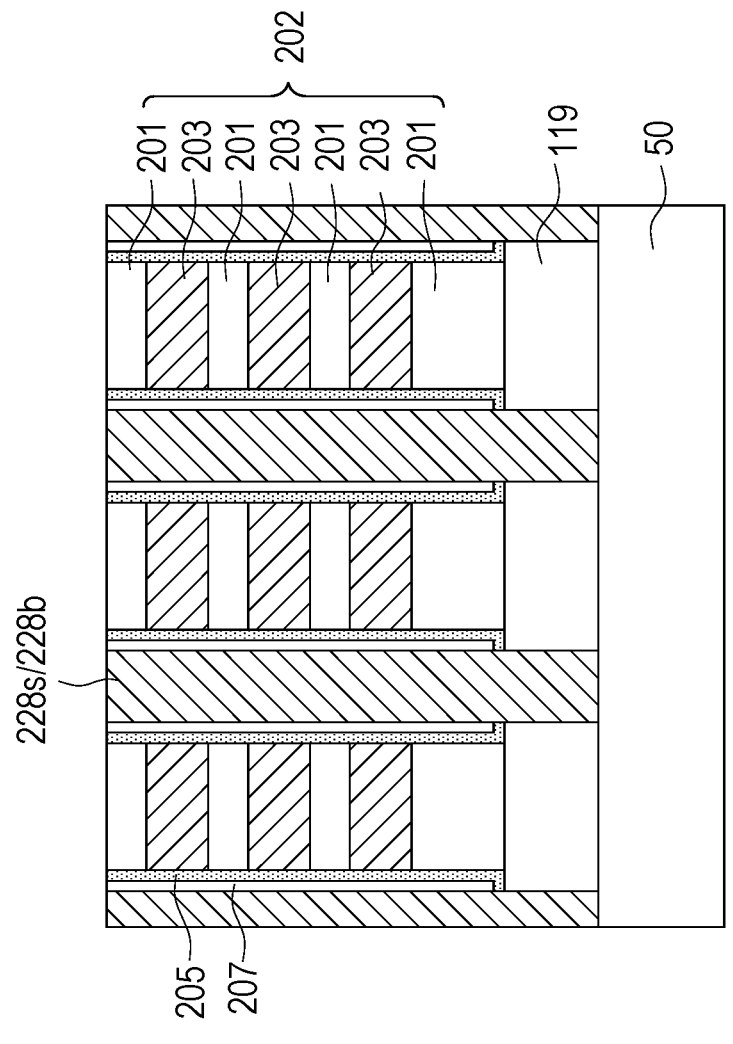
FIG. 14E illustrates a cross-sectional view of the FeRAM device taken along the plane E-E shown in FIG. 14A.

FIG. 14E illustrates a cross-sectional view of the FeRAM device 200 taken along the plane E-E shown in FIG. 14A. As can be seen, the conductive lines 228*s*, 228*b* are in contact with portions of the channel layer 207, the ferroelectric layer 205, the ESL 109, and the top surface of the substrate 50.

While not shown, it is contemplated that the FeRAM device 200 may undergo further processes to form various features contacts/vias, interconnect metal layers, dielectric layers, passivation layers, etc. For example, one or more dielectric layers may be formed over the layer stack 202, and openings may be formed in the dielectric layers to expose underlying source/drain regions (e.g., source lines 228*s* and the bit lines 228*b*). An electrically conductive material(s) is then formed in the openings to form source/drain contacts, which electrically couple to the source/drain regions (e.g., source lines 228*s* and the bit lines 228*b*). The source/drain contacts are electrically connected to a respective power supply. For example, the source contact can be electrically connected to a negative voltage (VSS) supply (i.e., ground or zero voltage) and the drain contact can be electrically connected to a positive voltage (VDD) supply.

Various embodiments of the present disclosure provide a memory device and methods of forming the same. The memory device includes a channel region disposed between adjacent source/drain regions, and a spacer disposed on opposite sides of the channel region. The channel region, the spacers, and the source/drain regions are disposed between and in contact with two adjacent channel layers, which are in contact with a ferroelectric layer. The channel layers may be formed of a n-type or p-type metal oxide, and the spacers are formed of a n-type or p-type metal oxide, wherein the spacers have a conductivity type that is opposite to the channel layer. The spacers serve as a source to provide additional hole carriers to the channel layer when a negative voltage is applied to a gate electrode, thereby enhancing the coupling electric field in the ferroelectric layer. As a result, a full polarization switching can be obtained in the ferro-electric layer during the program and erase operations. An enhanced fringing electric field also leads to a wider memory window and a prominent voltage drop in the ferroelectric layer, which increases the erase efficiency dur-ing the erase operation for the memory device.

An embodiment is a memory device. The memory device includes a first oxide material having a first sidewall and a second sidewall, a first spacer layer in contact with the first sidewall of the first oxide material, the first spacer layer having a first conductivity type, a second spacer layer in contact with the second sidewall of the first oxide material, wherein the second spacer layer has the first conductivity type. The memory device also includes a channel layer having a second conductivity type that is opposite to the first conductivity type, wherein the channel layer is in contact with the first oxide material, the first spacer layer, and the second spacer layer. The memory device further includes a ferroelectric layer in contact with the channel layer.

Another embodiment is a memory device. The memory device includes a layer stack over a substrate, wherein the layer stack includes alternating layers of a dielectric material and a word line material. The memory device also includes a ferroelectric layer extending from an upper surface of the layer stack distal to the substrate to a lower surface of the layer stack facing the substrate, wherein the ferroelectric layer is in contact with the alternating layers of the dielectric material and the word line material in the layer stack. The memory device also includes a channel layer having a first conductivity type, the channel layer extending from the upper surface of the layer stack to the lower surface of the layer stack, and the channel layer is in contact with portions of the ferroelectric layer. The memory device also includes a source line in contact with the channel layer, a bit line in contact with the channel layer, and a channel region dis-posed between the source line and the bit line. The channel region includes a first oxide material in contact with the channel layer and a spacer layer disposed on opposite sidewalls of the first oxide material, wherein the spacer layer has a second conductivity type that is opposite to the first conductivity type.

A further embodiment is a method for forming a memory device. The method includes forming a layer stack over a substrate, the layer stack comprising alternating layers of a dielectric material and an electrical conductive material, forming first trenches in the layer stack to expose a top surface of the substrate, forming a ferroelectric layer on exposed surfaces of the layer stack, forming a channel layer on the ferroelectric layer, the channel layer having a first conductivity type, filling the first trenches with a first oxide material, forming second trenches in the first oxide material, the second trenches extending through the first oxide mate-rial to expose the top surface of the substrate, filling the second trenches with a spacer material, the spacer material having a second conductivity that is opposite to the first conductivity type, removing portions of the spacer material to form spacers on opposite sides of the first oxide material and third trenches between adjacent spacers, filling the third trenches with a sacrificial layer, removing portions of the sacrificial layer to form openings in the sacrificial layer, filling the openings with a second oxide material, and replacing the sacrificial layers with an electrically conduc-tive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a memory device, comprising:
   forming a layer stack over a substrate, the layer stack comprising alternating layers of a dielectric material and an electrical conductive material;
   forming first trenches in the layer stack to expose a top surface of the substrate;
   forming a ferroelectric layer on exposed surfaces of the layer stack;
   forming a channel layer on the ferroelectric layer, the channel layer having a first conductivity type;
   filling the first trenches with a first oxide material;
   forming second trenches in the first oxide material, the second trenches extending through the first oxide mate-rial to expose the top surface of the substrate;

filling the second trenches with a spacer material, the spacer material having a second conductivity type that is opposite to the first conductivity type;

removing portions of the spacer material to form spacers on opposite sides of the first oxide material and third trenches between adjacent spacers, such that the spacers are physically separated from subsequently formed source/drain features by the third trenches;

filling the third trenches with a sacrificial layer;

removing portions of the sacrificial layer to form openings in the sacrificial layer;

filling the openings with a second oxide material; and replacing the sacrificial layers with an electrically conductive material.

2. The method of claim 1, wherein the channel layer and the spacer material are formed of a metal oxide semiconductor material.

3. The method of claim 2, wherein the removing portions of the sacrificial layer further comprises:

removing exposed portions of the channel layer to expose portions of the ferroelectric layer.

4. The method of claim 1, wherein the electrically conductive material forms source/drain features and are disposed immediately adjacent to the spacers.

5. The method of claim 2, wherein the channel layer is N-type or P-type metal oxide semiconductor material and the spacer material is P-type or N-type metal oxide semiconductor material.

6. The method of claim 1, further comprising:

prior to replacing the remaining sacrificial layers with an electrically conductive material, forming a barrier layer on exposed surfaces of the channel layer, the spacers, the second oxide material, and the top surface of the substrate.

7. The method of claim 1, wherein the first oxide material has a first length along a direction between the second trenches, and each spacer has a second length along the direction, the first length and the second length having a ratio of about 1:2 to about 5:1.

8. The method of claim 1, wherein the first oxide material, the spacers, and the channel layer each comprise a metal oxide semiconductor material, and the second oxide material comprises silicon oxide.

9. The method of claim 1, wherein after filling the openings with the second oxide material, the second oxide material is in direct contact with sidewalls of the channel layer and the ferroelectric layer.

10. The method of claim 1, wherein the electrically conductive material forms source lines and bit lines that are each in direct contact with the channel layer and separated from the first oxide material by the spacers.

11. The method of claim 2, wherein the removing portions of the sacrificial layer further comprises:

removing exposed portions of the channel layer to expose portions of the ferroelectric layer such that the second oxide material contacts the exposed portions of the ferroelectric layer.

12. A method for forming a memory device, comprising:

forming a layer stack over a substrate, the layer stack comprising alternating layers of a dielectric material and an electrically conductive material;

forming first trenches through the layer stack to expose the substrate;

conformally forming a ferroelectric layer and a channel layer over sidewalls and a bottom of the first trenches, the channel layer having a first conductivity type;

filling the first trenches with a first oxide material to form a channel region;

forming second trenches through the first oxide material to expose the substrate;

depositing a spacer material into the second trenches, the spacer material having a second conductivity type opposite the first conductivity type;

etching the spacer material to form discrete spacers on opposing sidewalls of the first oxide material and to define third trenches between adjacent spacers, such that the spacers are physically separated from subsequently formed source/drain features by the third trenches;

filling the third trenches with a sacrificial material;

partially etching the sacrificial material and exposed portions of the channel layer to form openings exposing portions of the ferroelectric layer;

filling the openings with a second oxide material; and prior to replacing the remaining sacrificial material with source/drain conductive features, forming a barrier layer lining the channel layer, the spacers, the second oxide material, and the exposed substrate.

13. The method of claim 12, wherein the partially etching the sacrificial material exposes sidewalls of the spacers such that the source/drain conductive features are immediately adjacent to but physically separated from the second oxide material by the spacers.

14. The method of claim 12, wherein the first oxide material has a first length and each spacer has a second length, the first length and the second length having a ratio of about 1:2 to about 5:1.

15. The method of claim 12, wherein the channel layer and the spacer material each comprise a metal oxide semiconductor material, and the channel layer comprises an n-type metal oxide semiconductor material while the spacer material comprises a p-type metal oxide semiconductor material.

16. A method for forming a memory device, comprising:

forming a layer stack over a substrate, the layer stack comprising alternating layers of a dielectric material and a word line material;

forming first trenches through the layer stack to expose the substrate;

forming a ferroelectric layer and an oxide semiconductor channel layer conformally along the first trenches, the channel layer having a first conductivity type;

filling the first trenches with a first insulating material to define a channel region between the first trenches;

after filling the first trenches, forming second trenches through the first insulating material and the channel region to expose the substrate;

filling the second trenches with a second oxide semiconductor material having a second conductivity type opposite the first conductivity type to form spacers laterally adjacent to the channel region;

forming third trenches between the spacers by etching the second oxide semiconductor material, such that the spacers are physically separated from subsequently formed source/drain features by the third trenches;

filling the third trenches with a sacrificial material;

selectively etching the sacrificial material to form source/drain openings while leaving the spacers intact between the channel region and the source/drain openings;

filling the source/drain openings with a third insulating material in direct contact with sidewalls of the channel layer and the ferroelectric layer; and replacing remaining portions of the sacrificial material with electrically conductive source/drain features such that the spacers enhance fringing electric fields in the ferroelectric layer adjacent to the channel region.

17. The method of claim 16, wherein the first insulating material has a first length and each spacer has a second length, the first length and the second length having a ratio of about 1:2 to about 5:1.

18. The method of claim 16, wherein the channel layer comprises an n-type metal oxide semiconductor material, and the second oxide semiconductor material comprises a p-type metal oxide semiconductor material.

19. The method of claim 16, wherein the third insulating material and the first insulating material comprise the same silicon oxide material.

20. The method of claim 18, further comprising:

prior to replacing the remaining portions of the sacrificial material, forming a barrier layer along exposed surfaces of the channel region, the spacers, and the third insulating material, wherein the barrier layer comprises titanium nitride or tantalum nitride.

\* \* \* \* \*